(12) United States Patent
Ishida

(10) Patent No.: US 8,418,009 B2
(45) Date of Patent: Apr. 9, 2013

(54) DELAY FAULT TESTING COMPUTER PRODUCT, APPARATUS, AND METHOD

(75) Inventor: Tsutomu Ishida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 348 days.

(21) Appl. No.: 12/778,329

(22) Filed: May 12, 2010

(65) Prior Publication Data
US 2010/0299096 A1    Nov. 25, 2010

(30) Foreign Application Priority Data

May 19, 2009    (JP) ................................. 2009-120958

(51) Int. Cl.
*G01R 31/28*    (2006.01)
(52) U.S. Cl. .......................... 714/731; 714/726; 714/733
(58) Field of Classification Search .................. 714/724, 714/726, 731, 733, 734, 741, 744, 25, 30; 716/106, 107
See application file for complete search history.

(56) References Cited

U.S. PATENT DOCUMENTS

| | | | |
|---|---|---|---|
| 4,852,093 A * | 7/1989 | Koeppe | 714/33 |
| 6,510,404 B1 * | 1/2003 | Kuriyama et al. | 703/6 |
| 7,516,383 B2 | 4/2009 | Hirano | |
| 7,913,214 B2 * | 3/2011 | Yamada | 716/113 |

FOREIGN PATENT DOCUMENTS

| | | |
|---|---|---|
| JP | 2005-257654 A | 9/2005 |
| JP | 2007-108863 A | 4/2007 |

OTHER PUBLICATIONS

Bastani, Pouria et al., "Statistical Diagnosis of Unmodeled Systematic Timing Effects", DAC 2008, 355-360.
Lee, Leonard et al., "A Path-Based Methodology for Post-Silicon Timing Validation", IEEE 2004, 713-720.
Wang, Zhiyuan et al., "Delay-Fault Diagnosis Using Timing Information", IEEE, Computer-Aided Design of Integrated Circuits and Systems, vol. 24, No. 9 2005, 1315-1325.

* cited by examiner

*Primary Examiner* — Christine Tu
(74) *Attorney, Agent, or Firm* — Fujitsu Patent Center

(57) ABSTRACT

A computer-readable medium stores therein a program that causes a computer to execute acquiring for each chip, first delay values of paths in chips manufactured using circuit information concerning a circuit-under-test; building a function model representing a delay value of a path, based on the first delay values for the path and the circuit information; calculating a second delay value of a path included in and having the same configuration in each chip, using a built function model and the circuit information; comparing for each chip, a given calculated second delay value and the first delay value of a given path having a configuration identical to that of the path for which the given second delay value has been calculated; determining based on a comparison result, the given path to be a path that includes a delay error occurring irregularly according to chip; and outputting a determination result.

7 Claims, 18 Drawing Sheets

| | PATH ID | GATE ID | SIGNAL LINE ID |
|---|---|---|---|
| 300-1 | $P_1$ | g1, g3, g8, g9 | s2, s5, s9 |
| | $P_2$ | g2, g3, g7, g10 | s1, s5, s6 |
| | ⋮ | ⋮ | ⋮ |
| 300-i | $P_i$ | $g_i1, g_i2, ..., g_ip$ | $s_i1, s_i2, ..., s_iq$ |
| | ⋮ | ⋮ | ⋮ |
| 300-n | $P_n$ | ... | ... |

FIG.4

PATH DELAY TABLE 400

| CHIP ID | PATH ID | POST-SILICON DELAY VALUE | ESTIMATED DELAY VALUE | FIRST FAULT FLAG | |
|---|---|---|---|---|---|
| C1 | $P_{11}$ | $d_{11}$ | $d'_1$ | OFF | 400-1-1 |
|  | $P_{21}$ | $d_{21}$ | $d'_2$ | OFF | |
|  | ... | ... | ... | ... | |
|  | $P_{i1}$ | $d_{i1}$ | $d'_i$ | OFF | 400-1-i |
|  | ... | ... | ... | ... | |
|  | $P_{n1}$ | $d_{n1}$ | $d'_n$ | OFF | 400-1-n |
| C2 | $P_{12}$ | $d_{12}$ | $d'_1$ | OFF | |
|  | ... | ... | ... | ... | |
|  | $P_{n2}$ | $d_{n2}$ | $d'_n$ | OFF | |
| ... | ... | ... | ... | ... | |
| Cm | $P_{nm}$ | $d_{nm}$ | $d'_n$ | OFF | |

400-1, 400-2, ..., 400-m

| PATH ID | GATE ID | SIGNAL LINE ID |
|---|---|---|
| $P_{1i}, P_{2i}$ | g3 | s5 |

RETRIEVAL RESULT TABLE — 700

FIG.12

PATH DELAY TABLE 1200

| CHIP ID | PATH ID | POST-SILICON DELAY VALUE | ESTIMATED DELAY VALUE | FIRST FAULT FLAG | SECOND FAULT FLAG |
|---|---|---|---|---|---|
| C1 | $P_{11}$ | $d_{11}$ | $d'_1$ | ON | OFF |
|  | $P_{21}$ | $d_{21}$ | $d'_2$ | OFF | OFF |
|  | ... | ... | ... | ... | ... |
|  | $P_{i1}$ | $d_{i1}$ | $d'_i$ | OFF | OFF |
|  | ... | ... | ... | ... | ... |
|  | $P_{n1}$ | $d_{n1}$ | $d'_n$ | OFF | OFF |
| C2 | $P_{12}$ | $d_{12}$ | $d'_1$ | OFF | OFF |
|  | $P_{n2}$ | $d_{n2}$ | $d'_n$ | OFF | OFF |
| ... | ... | ... | ... | ... | ... |
| Cm | $P_{nm}$ | $d_{nm}$ | $d'_n$ | OFF | OFF |

DELAY FAULT TESTING COMPUTER PRODUCT, APPARATUS, AND METHOD

CROSS REFERENCE TO RELATED APPLICATIONS

This application is based upon and claims the benefit of priority of the prior Japanese Patent Application No. 2009-120958, filed on May 19, 2009, the entire contents of which are incorporated herein by reference.

FIELD

The embodiments discussed herein are related to delay fault testing for testing a semiconductor integrated circuit for delay fault.

BACKGROUND

In recent years, the difference between post-silicon path delay (measured value) and pre-silicon path delay (estimated value) on a chip has become large due to microprocessing. Causes of the difference in path delays include a systematic error that is not chip-dependent (e.g., error in delay estimation at a cell library) and an irregular error unique to each chip (e.g., delay fault).

Various conventional methods for identifying an error-causing element have been provided for application to a case where a chip does not operate at a target frequency of the chip because of an irregular error unique each chip. Among such methods is, for example, a method of generating various test patterns, providing the generated test patterns to a chip, and retrieving an element causing an irregular error. Such methods are recited in Japanese Patent Laid-Open Publication Nos. 2005-257654 and 2007-108863, and taught by Bastani, Pouria, et al, "Statistical Diagnosis of Unmodeled Systematic Timing Effects", DAC 2008, pp. 355-360.

According to the above conventional methods, however, various test patterns are made and given to a chip, and path delay is measured several times to retrieve an error-causing element, arising in a problem that the time and effort expended to identify an error (delay fault) increases and consequently invites a longer design period.

SUMMARY

According to an aspect of an embodiment, a computer-readable recording medium storing therein a delay fault testing program causing a computer to execute acquiring for each chip, first delay values of paths included in a plurality of chips manufactured using circuit information concerning a circuit-under-test; building a function model representing a delay value of a path, based on the acquired first delay values for the path and the circuit information; calculating a second delay value of a path included in and having the same configuration in each of the chips, using a function model built at the building and the circuit information; comparing for each of the chips, a given calculated second delay value and the first delay value of a path having a configuration identical to that of the path for which the given second delay value has been calculated; determining based on a comparison result obtained at the comparing, the path having a configuration identical to that of the path for which the given second delay value has been calculated, to be a path that includes a delay error occurring irregularly according to chip; and outputting a determination result obtained at the determining.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 3 is an explanatory diagram of an example of a net list.
FIG. 4 is an explanatory diagram of an example of the contents of a path delay table.
FIG. 12 is an explanatory diagram of another example of the contents of a path delay table.

DESCRIPTION OF EMBODIMENTS

Preferred embodiments of the present invention will be explained with reference to the accompanying drawings.

Figure 1:
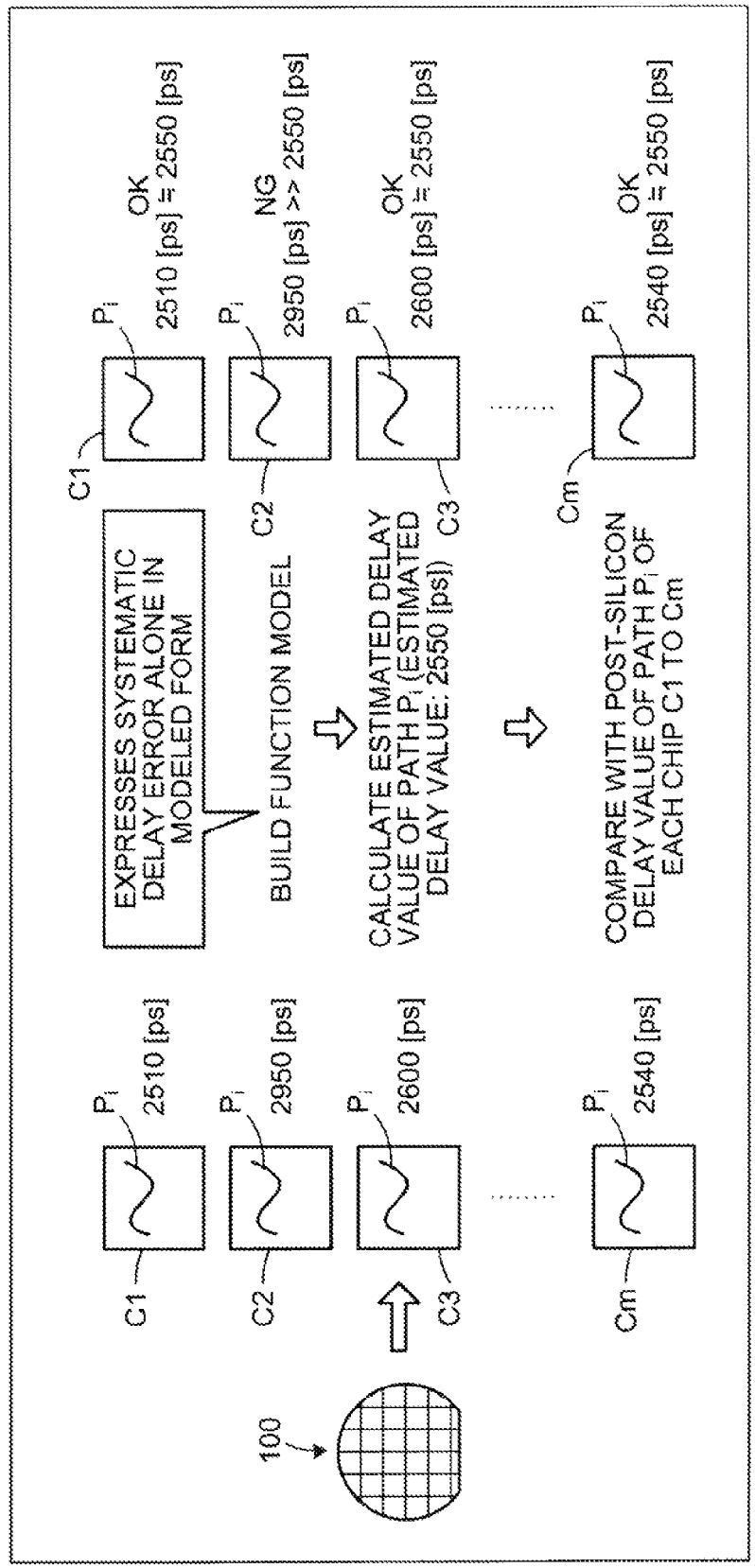
FIG. 1 is an explanatory diagram of an example of a delay fault testing method.

FIG. 1 is an explanatory diagram of an example of a delay fault testing method. FIG. 1 depicts chips C1 to Cm of the same configuration that are diced out from a wafer 100. FIG. 1 depicts a portion of the chips C1 to Cm.

FIG. 1 depicts a post-silicon delay value of a path $P_i$ included in each of the chips C1 to Cm. The post-silicon delay value is the path delay that is determined using a test result acquired in a test conducted by giving each of the chips C1 to Cm a test pattern generated by automatic test pattern generation (ATPG).

The post-silicon delay value of the path $P_i$ may include a delay value for a systematic error occurring in all chips C1 to Cm and a delay value for an error occurring irregularly according to chip C1 to Cm, in addition to a genuine delay value of the path $P_i$. The post-silicon delay value may be used as an approximation of the delay value of each path P.

A systematic error is, for example, a delay error that is not dependent on the chips C1 to Cm, such as erroneous delay estimation at a cell library and unevenness dependent on layout. An irregular error is, for example, a delay error that is dependent on the chips C1 to Cm and caused by a delay fault, Gaussian noises, particles entering a chip at manufacturing, etc.

According to the present method, using the post-silicon path delay of the path $P_i$ of each of the chips C1 to Cm, systematic delay error alone is modeled to build a function model representing a delay value of the path $P_i$ and then a delay value of the path $P_i$ (hereinafter "estimated delay value") is calculated using the built function model. An estimated delay value of the path Pi is assumed to be 2550 [ps].

Subsequently, according to the present method, the post-silicon delay value of the path $P_i$ of each of the chips C1 to Cm is compared with the estimated delay value of the path $P_i$. When a difference between the post-silicon delay value of the path $P_i$ and the estimated delay value of the path $P_i$ is beyond a tolerable range, the path $P_i$ is determined to be a fault path candidate. A fault path candidate is a path that has a high possibility of an occurrence of an irregular delay error unique to each of the chips C1 to Cm and that has a post-silicon delay value larger than that of another path. In this example, the path $P_i$ of a chip C2 is determined to be a delay path candidate.

In this manner, according to the present method, a path affected by a systematic delay error alone is excluded from the paths $P_i$ of each of the chips C1 to Cm, thereby narrowing down paths having a high possibility of occurrence of an irregular delay error unique to each of the chips C1 to Cm.

Figure 2:
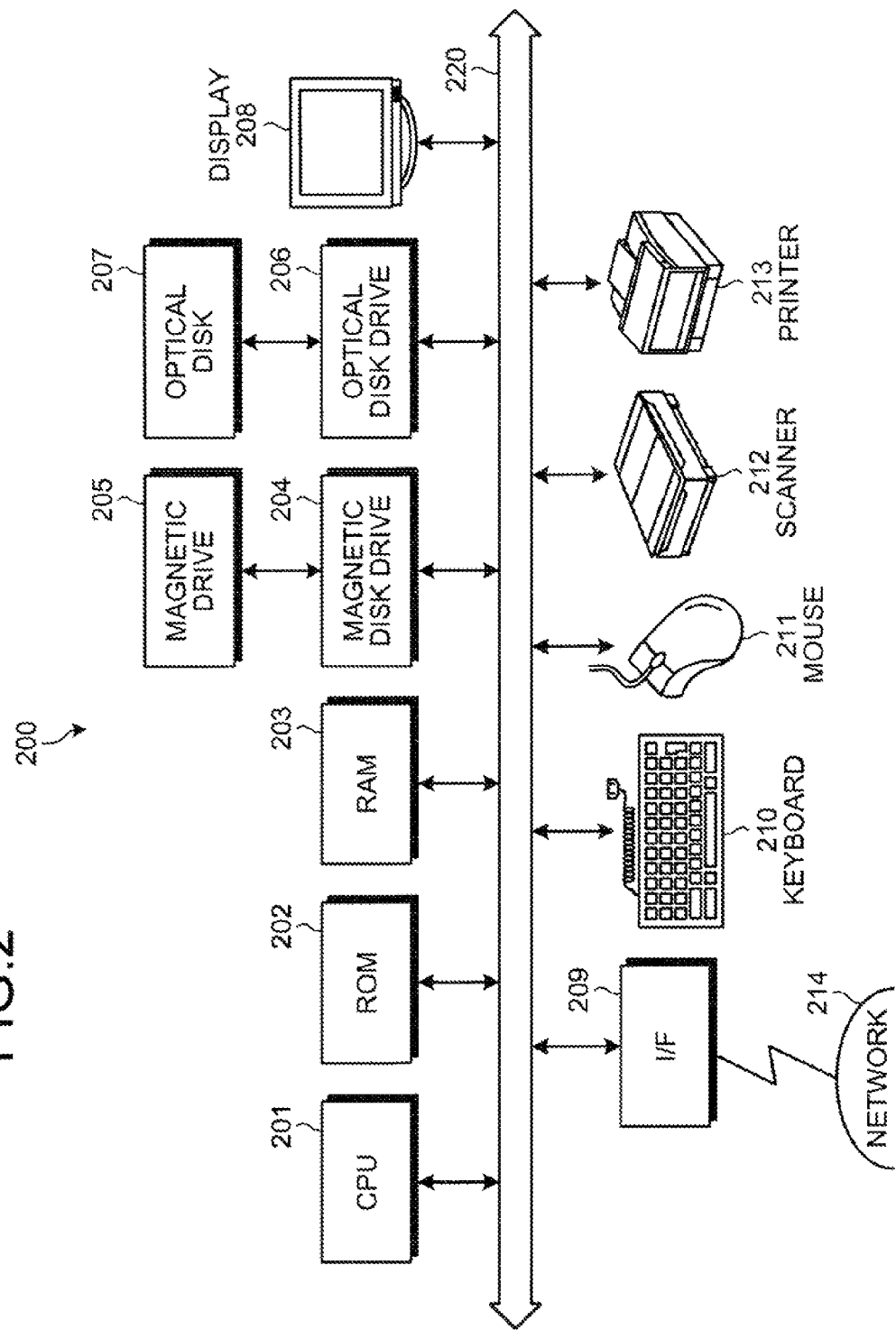
FIG. 2 is a block diagram of a delay fault testing apparatus.

FIG. 2 is a block diagram of a delay fault testing apparatus. As depicted in FIG. 2, a delay fault testing apparatus 200 includes a central processing unit (CPU) 201, a read-only memory (ROM) 202, a random access memory (RAM) 203, a magnetic disk drive 204, a magnetic disk 205, an optical disk drive 206, an optical disk 207, a display 208, a interface (I/F) 209, a keyboard 210, a mouse 211, a scanner 212, and a printer 213, respectively connected by a bus 220.

The CPU 201 governs overall control of the delay fault testing apparatus 200. The ROM 202 stores therein programs such as a boot program. The RAM 203 is used as a work area of the CPU 201. The magnetic disk drive 204, under the control of the CPU 201, controls the reading and writing of data with respect to the magnetic disk 205. The magnetic disk 205 stores therein the data written under control of the magnetic disk drive 204.

The optical disk drive 206, under the control of the CPU 201, controls the reading and writing of data with respect to the optical disk 207. The optical disk 207 stores therein the data written under control of the optical disk drive 206, the data being read by a computer.

The display 208 displays, for example, data such as text, images, functional information, etc., in addition to a cursor, icons, and/or tool boxes. A cathode ray tube (CRT), a thin-film-transistor (TFT) liquid crystal display, a plasma display, etc., may be employed as the display 208.

The I/F 209 is connected to a network 214 such as a local area network (LAN), a wide area network (WAN), and the Internet through a communication line and is connected to other apparatuses through the network 214. The I/F 209 administers an internal interface with the network 214 and controls the input/output of data from/to external apparatuses. For example, a modem or a LAN adaptor may be employed as the I/F 209.

The keyboard 210 includes, for example, keys for inputting letters, numerals, and various instructions and performs the input of data. Alternatively, a touch-panel-type input pad or numeric keypad, etc. may be adopted. The mouse 211 is used to move the cursor, select a region, or move and change the size of windows. A track ball or a joy stick may be adopted provided each respectively has a function similar to a pointing device.

The scanner 212 optically reads an image and takes in the image data into the delay fault testing apparatus 200. The scanner 212 may have an optical character recognition (OCR) function as well. The printer 213 prints image data and text data. The printer 213 may be, for example, a laser printer or an ink jet printer.

FIG. 3 is an explanatory diagram of an example of a net list. As depicted in FIG. 3, a net list 300 has fields for path ID, gate ID, and signal line ID. With information set in each field, connection information 300-1 to 300-n concerning paths $P_1$ to $P_n$ in a circuit-under-test is stored in the net list 300 as respective records.

Path ID represents an identifier for a path in the circuit-under-test. In the circuit-under-test, a path is, for example, a path from an input terminal to a flip-flop (FF), a path between an input terminal and an output terminal, a path between different FFs, a path from an FF to an output terminal, etc. Gate ID represents an identifier for a gate in a path. A gate is, for example, a logic circuit of AND, OR, NOT, NAND, etc. Signal line ID represents an identifier for a signal line connecting a gate to another gate in a path.

The path $P_i$, for example, includes gates $g_i1, g_i2, \ldots, g_ip$ and signal lines $s_i1, s_i2, \ldots, s_iq$. The net list 300 is stored in a storage apparatus, such as the ROM 202, the RAM 203, the magnetic disk 205, and the optical disk 207 depicted in FIG. 2.

FIG. 4 is an explanatory diagram of an example of the contents of a path delay table. As depicted in FIG. 4, a path delay table 400 has fields for chip ID, path ID, post-silicon delay value, estimated delay value, and first fault flag. With information set in each field, path delay information 400-1 to 400-m concerning the chips C1 to Cm is stored in the table as respective records.

In the path delay table 400, chip ID represents identifiers for chips manufactured using the net list 300 depicted in FIG. 3, path ID represents an identifier for a path in a chip, and post-silicon delay value represents a delay value of a path that is activated in a test.

Estimated delay value represents a delay value of a path and is calculated by modeling the systematic delay error alone. First fault flag is a flag that indicates a path having a high possibility of an occurrence of an irregular error unique to each of the chips C1 to Cm. When the first fault flag is "ON", the flag indicates that the corresponding path has a high possibility of an occurrence of an irregular error. The first fault flag is "OFF" in the initial state.

Path delay information 400-1, for example, includes path delay information 400-1-1 to 400-1-n concerning paths $P_{11}$ to $P_{n1}$ in the chip C1. In the case of path delay information 400-1-i, a post-silicon delay value "$d_{i1}$", an estimated delay value "$d'_i$", and a first fault flag "OFF" are recorded for a path $P_{i1}$. The path delay table 400 is stored in a storage apparatus, such as the RAM 203, the magnetic disk 205, and the optical disk 207.

Reference concerning a method of calculating a post-silicon delay value of a path can be made to Lee, Leonard, et al, "A Path-Based Methodology for Post-Silicon Timing Validation", 2004 IEEE, pp. 713-720.

Figure 5:
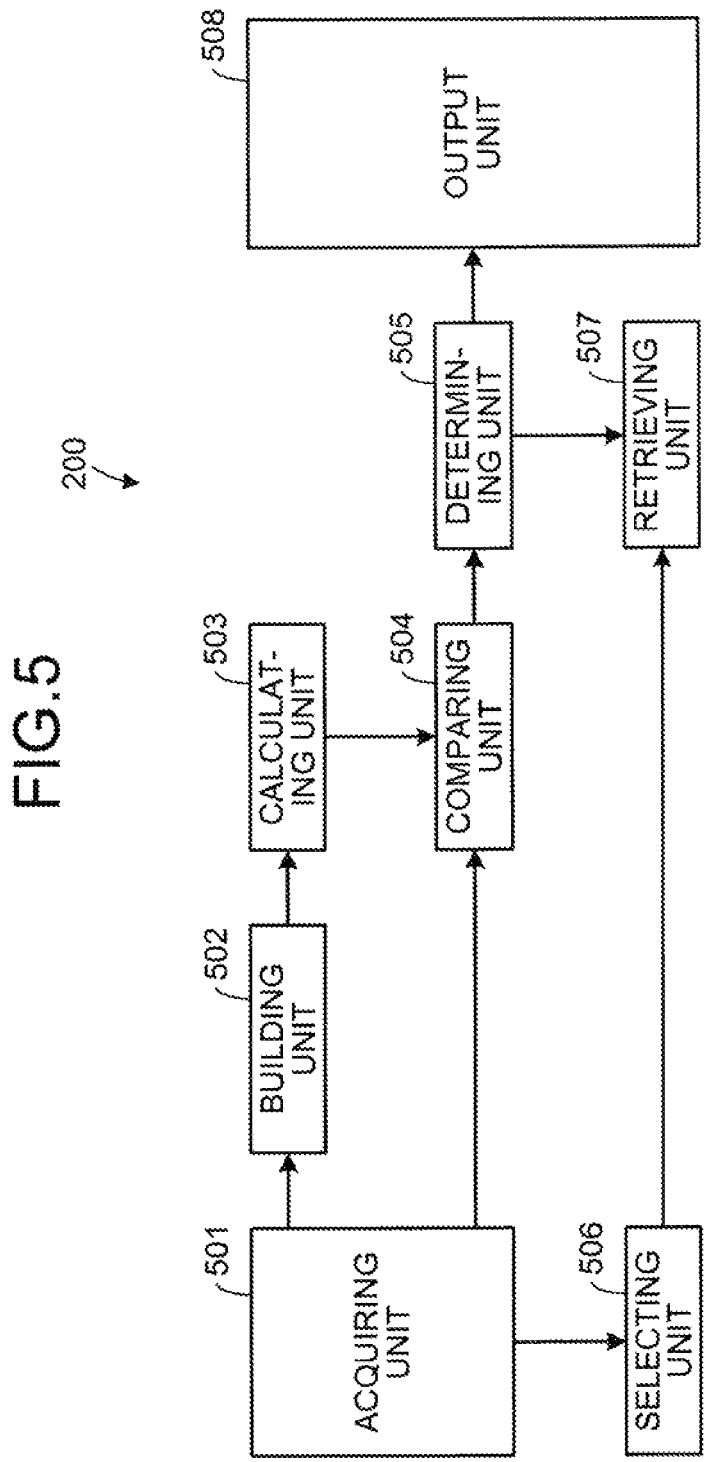
FIG. 5 is a functional diagram of a delay fault testing apparatus according to a first embodiment.

FIG. 5 is a functional diagram of a delay fault testing apparatus according to a first embodiment. As depicted in FIG. 5, a delay fault testing apparatus 200 includes an acquiring unit 501, a building unit 502, a calculating unit 503, a comparing unit 504, a determining unit 505, a selecting unit 506, a retrieving unit 507, and an output unit 508. These functional units (acquiring unit 501 to output unit 508) serving as a control unit, are implemented, for example, when the CPU 201 executes programs stored in a storage apparatus, such as the ROM 202, the RAM 203, the magnetic disk 205 and the optical disk 207, or by the I/F 209.

The acquiring unit 501 has a function of acquiring circuit information concerning the circuit-under-test. The circuit-under-test is a semiconductor integrated circuit, such as a large-scale integrated (LSI) circuit. Circuit information is connection information concerning connections between terminals in the circuit-under-test, and the net list 300 depicted in FIG. 3 is an example of connection information.

For example, the acquiring unit 501 acquires circuit information through user input via the keyboard 210, mouse 211, etc. The acquiring unit 501 may acquire circuit information by extracting the circuit information from a non-depicted database or library. Acquired circuit information is stored in a storage apparatus, such as the RAM 203, the magnetic disk 205, and the optical disk 207.

In the present specification, the net list 300 depicted in FIG. 3 will be regarded as an example of circuit information concerning the circuit-under-test in the following description.

The acquiring unit 501 has a function of acquiring, for each of the chips C1 to Cm, a first delay value of the path $P_i$ that is included in each of the chips C1 to Cm manufactured using the net list 300 and that has an identical configuration in each chip C1 to Cm. The first delay value is a delay value of the path $P_i$ on a chip Cj, which is, for example, the post-silicon delay value depicted in FIG. 4.

For example, the acquiring unit 501 acquires a first delay value of a path $P_{ij}$ through user input via the keyboard 210, mouse 211, etc. The acquiring unit 501 may acquire the first delay value of the path $P_{ij}$ by extracting the first delay value from a non-depicted database or library. The acquired first delay value of the path $P_{ij}$ is stored, for example, in the path delay table 400 depicted in FIG. 4.

In the present specification, a post-silicon delay value $d_{ij}$ of the path $P_{ij}$ in FIG. 4 will be regarded as an example of the first delay value of the path $P_i$ in the chip Cj in the following description. A set of all paths of the chips C1 to Cm includes paths having passed an operation test and paths having failed the test. A case is assumed where paths having passed the operation test are greater in number than paths having failed the test in the set of all paths.

The building unit 502 has a function of building a function model representing a delay value of the path $P_i$, based on the post-silicon delay value $d_{ij}$ of the path $P_{ij}$ and on the net list 300. The function model to be built is a polynomial that expresses the delay value of the path $P_i$ through modeling of a delay error occurring in common in the chips C1 to Cm.

For example, the building unit 502 builds the function model expressing the delay value of the path $P_i$, using ε-SVR (support vector regression) or least squares. ε-SVR is a method of building a function model for determining the delay value of the path $P_i$ with consideration given to unevenness through a ε-insensitive function.

For example, the building unit 502 determines factors $X_1$ to $X_p$ and $Y_1$ to $Y_q$ included in (1), using ε-SVR. In equation (1), $d'_i$ denotes the delay value of the path $P_i$, g1 to gp denote variables that take a value of "1" when the path $P_i$ includes gates g1 to gp and that take a value of "0" when the path $P_i$ does not include gates g1 to gp, and s1 to sq denote variables that take a value of "1" when the path $P_i$ includes signal lines s1 to sq and that take a value of "0" when the path $P_i$ does not include signal lines s1 to sq.

$$d'_1 = (X_1 \cdot g1 + X_2 \cdot g2 + \ldots + X_p \cdot gp) + (Y_1 \cdot s1 + Y_2 \cdot s2 + \ldots + Y_p \cdot sq) \quad (1)$$

For example, the building unit 502 substitutes the post-silicon delay values $d_{ij}$ of respective paths $P_{ij}$ to the left side of equation (1) while substituting connection information 300-$i$ of respective paths $P_i$ to the right side of equation (1). This makes n×m equations having the factors $X_1$ to $X_p$ and $Y_1$ to $Y_q$ as unknown values.

Subsequently, the building unit 502 determines the factors $X_1$ to $X_p$ and $Y_1$ to $Y_q$ that minimize error between the left side and the right side of each equation, using ε-SVR (or least squares). A built function model is stored in a storage apparatus, such as the RAM 203, the magnetic disk 205, and the optical disk 207.

As mentioned above, in the set of all paths, paths having passed the operation test are greater in number than paths having failed the test and the paths having passed the test are paths that do not include a delay fault. In the function model, therefore, only the delay error occurring in common in the chips C1 to Cm is expressed in a modeled form.

The calculating unit 503 has a function of calculating a second delay value of the path $P_i$ using a built function model and the net list 300. The second delay value of the path $P_i$ is an estimated delay value of the path $P_i$ that is a modeled expression of a systematic delay error. For example, the calculating unit 503 substitutes connection information 300-$i$ of the path $P_i$ to the right side of equation (1) to calculate an estimated delay value $d'_i$ of the path $P_i$, provided that the factors $X_1$ to $X_p$ and $Y_1$ to $Y_q$ are known.

The estimated delay value resulting from the calculation is stored in, for example, the path delay table 400. For example, the calculating unit 503 sets the estimated delay value $d'_i$ of the path $P_i$ in the field for estimated delay values of paths $P_{i1}$ to $P_{im}$ in the path delay table 400.

The comparing unit 504 has a function of comparing for each of the chips C1 to Cm, the post-silicon delay value $d_{ij}$ of the path $P_{ij}$ and the estimated delay value $d'_i$ of the path $P_i$. For example, the comparing unit 504, referring to the path delay table 400, subtracts the estimated delay value $d'_i$ of the path $P_i$ from the post-silicon delay value $d_{ij}$ of the path $P_{ij}$, to calculate a difference between the values. The calculated difference resulting from the comparison is stored in a storage apparatus, such as the RAM 203, the magnetic disk 205, and the optical disk 207.

The determining unit 505 has a function of determining the path $P_{ij}$ to be a path that includes a delay error irregularly occurring according to chip C1 to Cm, based on the calculated difference. For example, the determining unit 505 determines a path $P_{ij}$ that makes the calculated difference equal to or greater than a threshold to be a path that includes a delay error irregularly occurring according to chip C1 to Cm (hereinafter "fault path candidate"). The threshold may be set arbitrarily. For example, the determining unit 505 determines the threshold to be 10 to 20% of the estimated delay value $d'_i$ of the path P.

The path determined as a fault path candidate is stored, for example, in the path delay table 400. For example, the determining unit 505 turns the first fault flag for the fault path candidate from "OFF" to "ON" in the path delay table 400. Hereinafter, a fault path candidate included in the chip Cj will be expressed as "fault path candidate $P'_{ij}$," and a path set consisting of fault path candidates will be expressed as "path set $S'_{ij}$" ($i=1, 2, \ldots, t \leq n$).

The output unit 508 has a function of outputting a determination result obtained by the determining unit 505. For example, the output unit 508 referring to the path delay table 400, may output report information enumerating path IDs for paths $P_{ij}$ with the first fault flag set "ON". This enables presentation of a path that includes an element highly likely to cause a delay fault, to the user.

Forms of output include display on the display 208, print out by the printer 213, and transmission to an external apparatus through the I/F 209. A determination result may be stored in a storage apparatus, such as the RAM 203, the magnetic disk 205, and the optical disk 207.

The selecting unit 506 has a function of selecting from among the chips C1 to Cm, a chip Cj. For example, the selecting unit 506 selects an arbitrary chip ID "Cj", from among chip IDs "C1 to Cm". The selected chip ID is stored in a storage apparatus, such as the RAM 203, the magnetic disk 205, and the optical disk 207.

The retrieving unit 507 has a function of searching for, based on the net list 300, a common element included in first and second fault path candidates, among paths making up the path set $S'_{ij}$ of the selected chip Cj. For example, the retrieving unit 507 searches gates and signal lines included in the first and the second fault path candidates to retrieve a common gate or signal line.

Figures 6, 7:
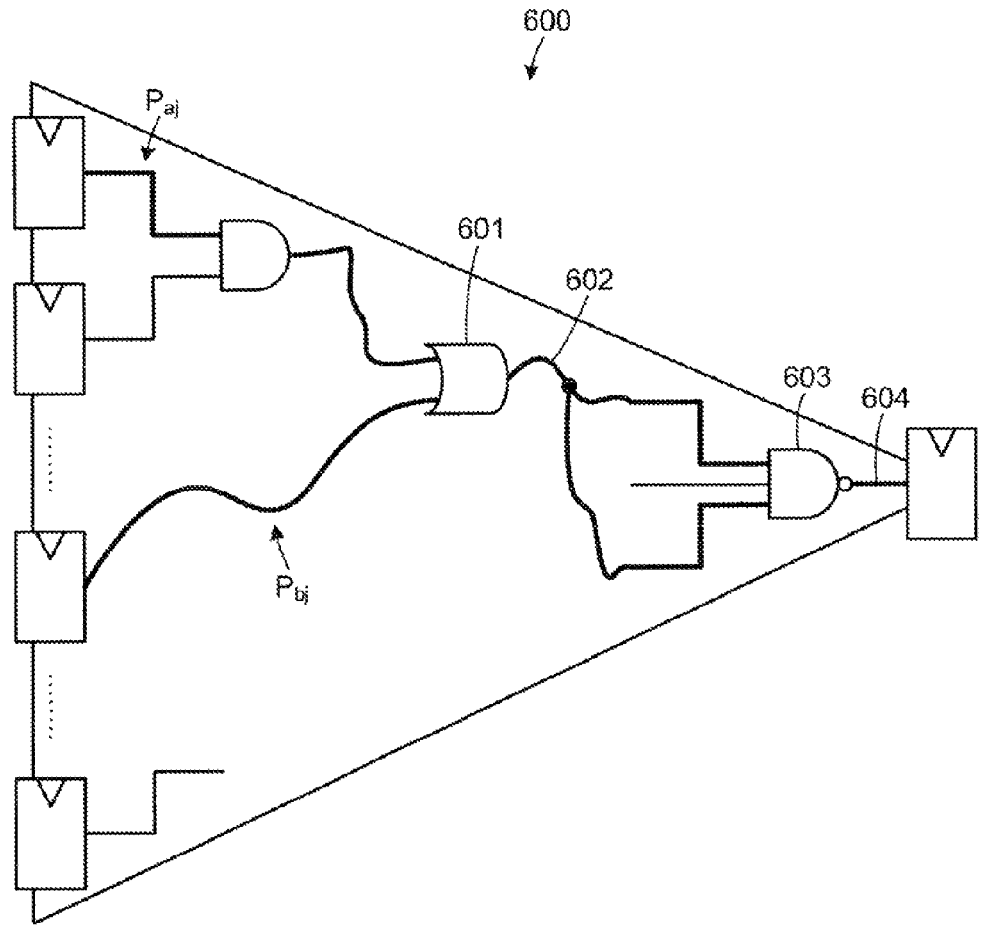
FIG. 6 is an explanatory diagram of an example of retrieval of a common element.
FIG. 7 is an explanatory diagram of an example of the contents of a retrieval result table.

FIG. 6 is an explanatory diagram of an example of retrieval of a common element. FIG. 6 depicts a logic cone 600 of a combination circuit in the chip Cj. A logic cone is an element set consisting of FFs and gates passed through along paths from the fan-in of a given FF to other FFs.

In FIG. 6, paths $P_{aj}$ and $P_{bj}$ in the logic cone 600 are fault path candidates. In this case, the retrieving unit 507 retrieves, as common elements, gates 601 and 603 and signal lines 602 and 604 included in both paths $P_{aj}$ and $P_{bj}$. The retrieved common elements are stored in a retrieval result table 700 depicted in FIG. 7.

Reference concerning a method of retrieving a common element can be made to "Wang, Zhiyuan, et al, "Delay-Fault Diagnosis Using Timing Information", COMPUTER-AIDED DESIGN OF INTEGRATED CIRCUITS AND SYSTEMS, VOL. 24, No. 9, SEPTEMBER 2005, IV. 5.

The output unit 508 has a function of outputting retrieved common elements. For example, the output unit 508 may output the retrieval result table 700 depicted in FIG. 7. FIG. 7 is an explanatory diagram of an example of the contents of a retrieval result table. As depicted in FIG. 7, the retrieval result table 700 has fields for path ID, gate ID, and signal line ID. With information set in each field, a retrieval result is stored as a record.

In the retrieval result table 700, path ID represents respective path IDs for first and second fault path candidates, gate ID represents a gate included in common in the first and the second fault path candidates, and signal ID represents a signal line included in common in the first and the second fault path candidates.

Hence, common elements "gate g3 and signal line s5" included in common in paths $P_{11}$ and $P_{21}$ determined to be fault path candidates are presented to the user. The retrieval result table 700 is stored in a storage apparatus, such as the RAM 203, the magnetic disk 205, and the optical disk 207.

Figure 8:
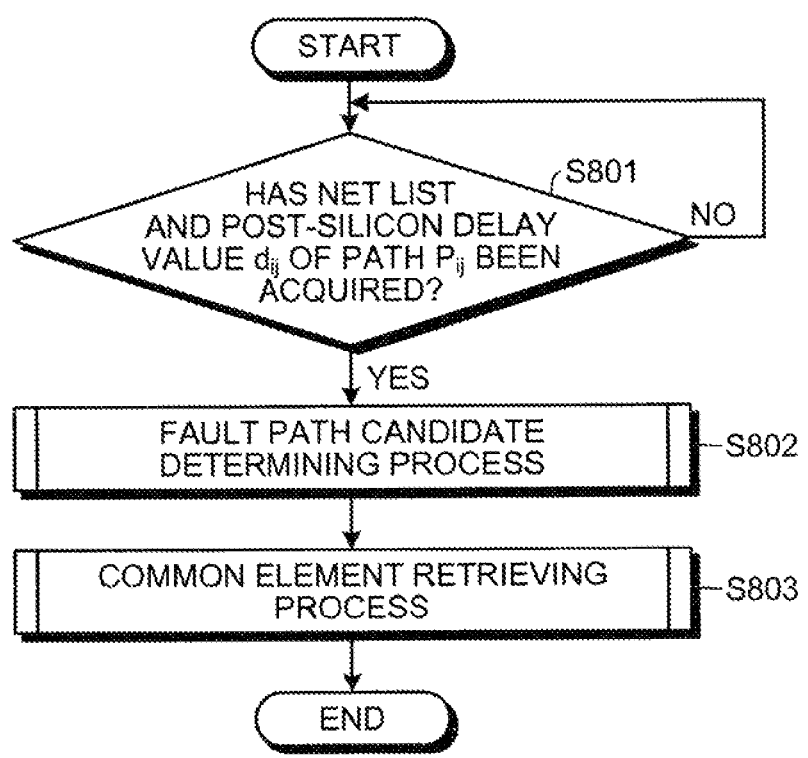
FIG. 8 is a flowchart of an example of a delay fault test procedure according to the first embodiment.

FIG. 8 is a flowchart of an example of a delay fault test procedure according to the first embodiment. As depicted in the flowchart, the acquiring unit 501 determines whether the net list 300 for a circuit-under-test and the post-silicon delay value $d_{ij}$ of the path $P_{ij}$ have been acquired (step S801).

Waiting occurs until the net list 300 and the post-silicon delay value $d_i$ are acquired (step S801: NO). When the net list 300 and the post-silicon delay value $d_{ij}$ have been acquired (step S801: YES), the determining unit 505 executes a fault path candidate determining process (step S802). Subsequently, the retrieving unit 507 executes a common element retrieving process (step S803), after which a series of processes according to the flowchart is ended.

Figure 9:
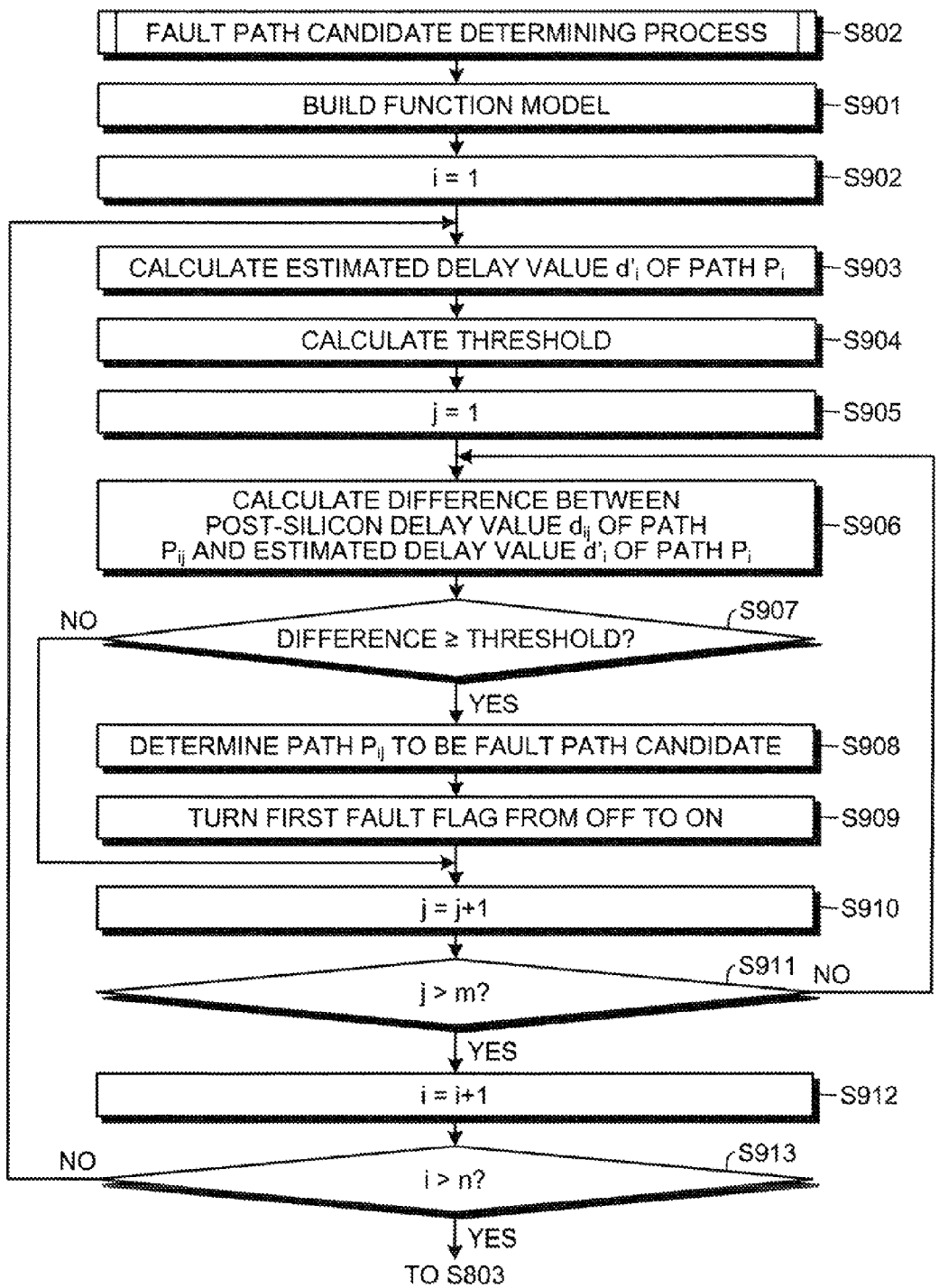
FIG. 9 is a flowchart of an example of a procedure of a fault path candidate determining process.

FIG. 9 is a flowchart of an example of a procedure of the fault path candidate determining process.

As depicted in the flowchart, the building unit 502 models a delay error occurring in common in each of the chips C1 to Cm to build a function model representing a delay value of the path $P_i$ (step S901). For example, the building unit 502 substitutes the post-silicon delay value $d_{ij}$ of the path $P_{ij}$ and connection information 300-$i$ of the path $P_i$ into equation (1) to determine the factors $X_1$ to $X_p$ and $Y_1$ to $Y_q$.

"i=1" is then set (step S902), and the calculating unit 503 calculates the estimated delay value $d'_i$ of the path $P_i$ using the built function model and the net list 300 (step S903). The determining unit 505 calculates a threshold using the estimated delay value $d'_i$ of the path $P_i$ (step S904).

"j=1" is then set (step S905), and the comparing unit 504 calculates the difference between the post-silicon delay value $d_{ij}$ of the path $P_{ij}$ and the estimated delay value $d'_i$ of the path $P_i$ (step S906). The determining unit 505 determines whether the calculated difference is at least the threshold calculated at step S904 (step S907).

If the difference is at least the threshold (step S907: YES), the determining unit 505 determines the path $P_{ij}$ to be a fault path candidate (step S908), and then turns the first fault flag for the fault path candidate from "OFF" to "ON" in the path delay table 400 (step S909).

Subsequently, j is incremented by one (step S910), and whether "j>m" is satisfied is determined (step S911). If "j≦m" is true (step S911: NO), the procedure returns to step S906. If "j>m" is true (step S911: YES), i is incremented by one (step S912), and whether "i>n" is satisfied is determined (step S913).

If "i≦n" is true (step S913: NO), the procedure returns to step S903. If "i>n" is true (step S913: YES), the procedure proceeds to step S803 in FIG. 8. If the difference is smaller than the threshold at step S907 (step S907: NO), the procedure proceeds to step S910.

Through this procedure, fault path candidates that include a delay error irregularly occurring according to chip C1 to Cm can be narrowed down from a set of all paths included in the chips C1 to Cm.

Figure 10:
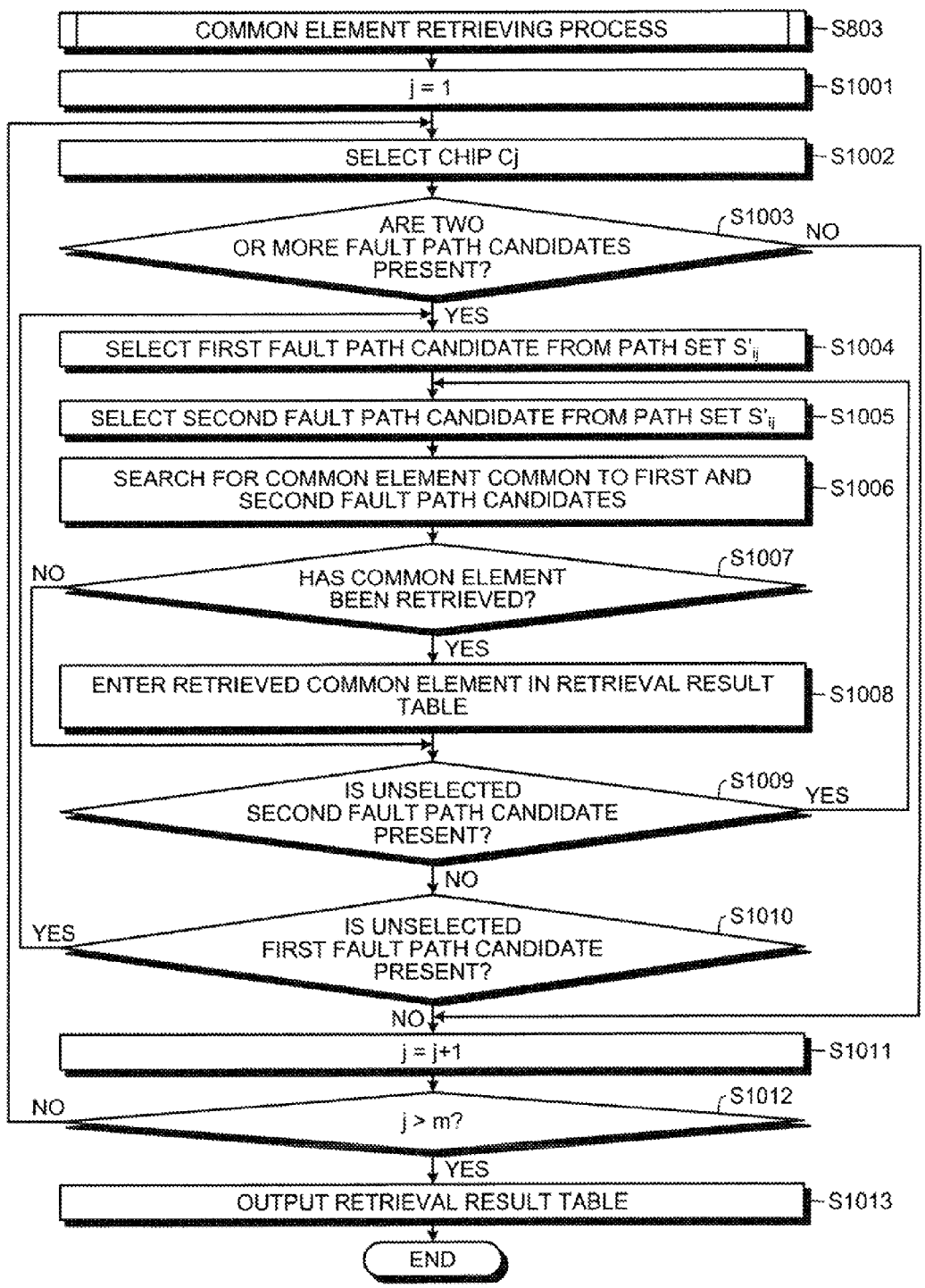
FIG. 10 is a flowchart of an example of a procedure of a common element retrieving process.

A procedure of the common element retrieving process at step S803 of FIG. 8 will be described in detail. FIG. 10 is a flowchart of an example of a procedure of the common element retrieving process. As depicted in the flowchart, "J=1" is set (step S1001), and the selecting unit 506 selects the chip Cj from among the chips C1 to Cm (step S1002).

Subsequently, the retrieving unit 507 determines whether at least two fault path candidates are present in the path set $S'_{ij}$ included in the selected chip Cj (step S1003). If two or more fault path candidates are present (step S1003: YES), the retrieving unit 507 selects a first fault path candidate from the path set $S'_{ij}$ (step S1004).

The retrieving unit 507 further selects a second fault path candidate, from the path set $S'_{ij}$ (step S1005). The first and the second fault path candidates are paths different from each other. The retrieving unit 507 then searches for a common element common to the first and the second fault path candidates (step S1006).

Subsequently, the retrieving unit 507 determines whether a common element has been retrieved (step S1007). If a common element has not been retrieved (step S1007: NO), the procedure proceeds to step S1009. If a common element has been retrieved (step S1007: YES), the retrieving unit 507 enters the retrieved common element in the retrieval result table 700 (step S1008).

The retrieving unit 507 then determines whether a second fault path candidate not selected at step S1005 is present (step S1009). If an unselected second fault path candidate is present (step S1009: YES), the procedure returns to step S1005.

If an unselected second fault path candidate is not present (step S1009: NO), the retrieving unit 507 determines whether a first fault path candidate not selected at step S1004 is present (step S1010). If an unselected first fault path candidate is present (step S1010: YES), the procedure returns to step S1004.

If an unselected first fault path candidate is not present (step S1010: NO), j is incremented by one (step S1011), and the retrieving unit 507 determines whether "j>m" is satisfied (step S1012). If "j≦m" is true (step S1012: NO), the procedure returns to step S1002.

If "j>m" is true (step S1012: YES), the output unit 508 outputs the retrieval result table 700 (step S1013), after which a series of processes according to this flowchart is ended. When one or fewer fault path candidates are present at step S1003 (step S1003: NO), the procedure proceeds to step S1011.

Through this procedure, elements causing a delay error irregularly occurring according to chip C1 to Cm can be narrowed down from a group of elements included in a fault path candidate.

As described above, according to the first embodiment, when a difference between the post-silicon delay value $d_{ij}$ of the path $P_{ij}$ and the estimated delay value $d'_i$ of the path $P_i$ is beyond a tolerable range, a path defined as the path $P_{ij}$ is determined to be a fault path candidate. As a result, a path affected by systematic delay error alone is excluded from a set of all paths included in the chips C1 to Cm to narrow down fault path candidates that have a delay error irregularly occurring according to chip C1 to Cm.

According to the first embodiment, from the path set $S'_{ij}$ in the chip Cj, a common element included in common in first and second fault path candidates can be retrieved for output. As a result, elements causing a delay error irregularly occurring according to chip C1 to Cm can be narrowed down from a group of elements included in a fault path candidate.

According to the first embodiment, trouble and time consumed to identify a delay fault occurring irregularly according to chip C1 to Cm can be reduced. For example, it is unnecessary to generate a new test pattern to identify a delay fault in a chip and it is also unnecessary to conduct a test using a tester.

A delay fault testing method according to a second embodiment will be described. The method of excluding, from a set of all paths included in the chips C1 to Cj, a path affected by a systematic delay error alone to narrow down fault path candidates is described in the first embodiment. The post-silicon delay value $d_{ij}$ of the path $P_{ij}$, however, may include an error resulting from erroneous estimation.

The path set $S'_{ij}$ of the chip Cj, therefore, may include a path with an erroneously estimated post-silicon delay value $d_{ij}$. In other words, the post-silicon delay value $d_{ij}$ of the path $P_{ij}$ may become large because of erroneous estimation and such a path $P_{ij}$ may be determined to be a fault path candidate. In the second embodiment, a method of excluding a path with an erroneously estimated post-silicon delay value $d_{ij}$ from the path set of the chip Cj will be described. Components identical to those described in the first embodiment will not be depicted nor described further.

Figure 11:
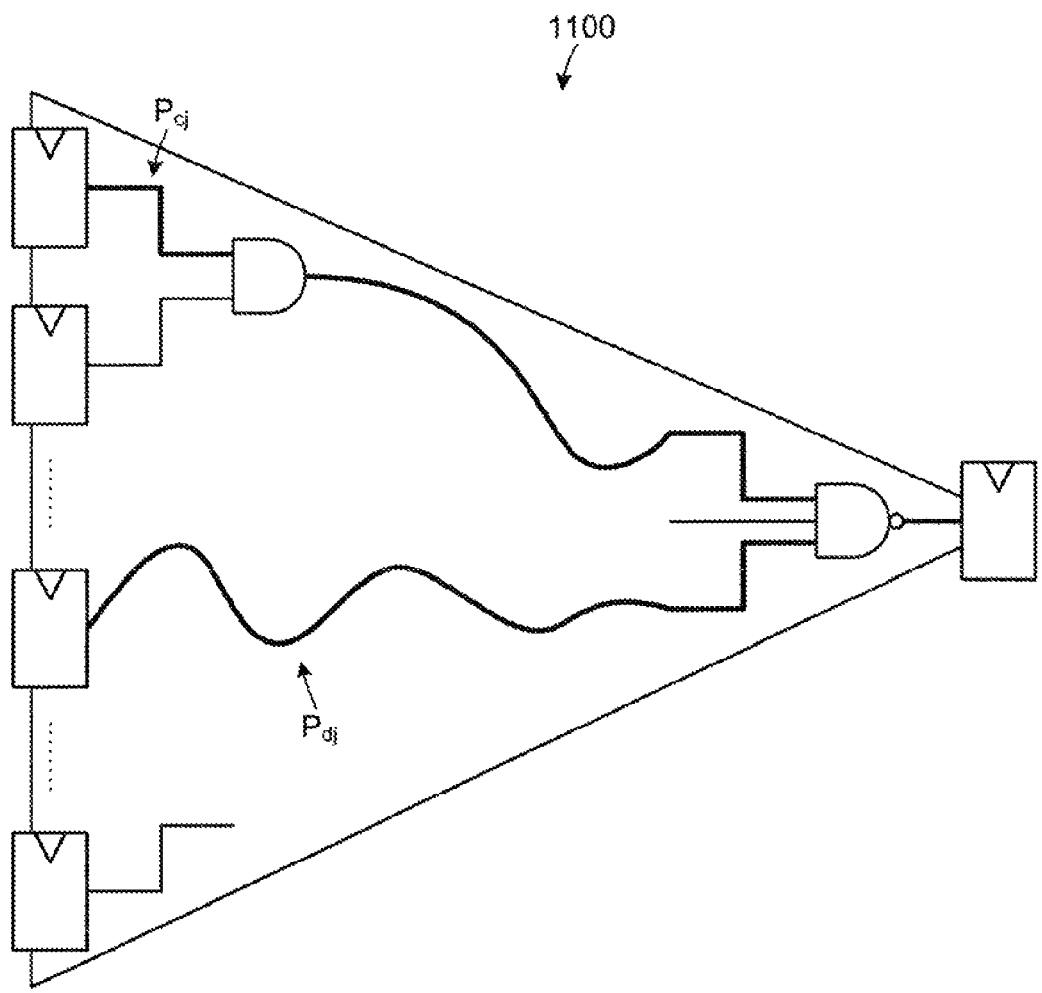
FIG. 11 is an explanatory diagram of an example of erroneous estimation of the post-silicon delay value.

An example of erroneous estimation of the post-silicon delay value $d_{ij}$ of the path $P_{ij}$ will be described. FIG. 11 is an explanatory diagram of erroneous estimation of the post-silicon delay value $d_{ij}$ of the path $P_{ij}$. FIG. 11 depicts a logic cone 1100 of a combination circuit in the chip Cj. A path $P_{cj}$ and a path $P_{dj}$ in the logic cone 1100 are paths activated by a given test pattern. A path delay of the path $P_{cj}$ is 2800 [ps] and a path delay of the path $P_{dj}$ is 1600 [ps].

In this case, the result of a test on the chip Cj demonstrates that the chip Cj operates normally at a clock frequency of 2800 [ps] or higher. Post-silicon path delay values $d_{cj}$ and $d_{dj}$ of the path $P_{cj}$ and path $P_{dj}$ are, therefore, determined to be the same, 2800 [ps]. As a result, the post-silicon path delay value $d_{dj}$ of the path $P_{dj}$ is determined to be 2800 [ps] despite the actual post-silicon path delay value $d_{dj}$ of the path $P_{dj}$ being 1600 [ps]. Hence, erroneous estimation occurs.

In the second embodiment, a path with an erroneously estimated post-silicon delay value $d_{ij}$ is excluded from the path set $S'_{ij}$ of the chip Cj by narrowing down paths correlated with each other with attention paid to individual chips Cj. A path delay table 1200 used by a delay fault testing apparatus 1300 depicted in FIG. 13 will be described.

FIG. 12 is an explanatory diagram of another example of the contents of a path delay table. As depicted in FIG. 12, a path delay table 1200 has fields for chip ID, path ID, post-silicon delay value, estimated delay value, first fault flag and second fault flag. With information set in each field, path delay information 1200-1 to 1200-$m$ concerning the chips C1 to Cm is stored in the table as respective records.

Second fault flag represents a flag for distinguishing a path with an erroneously estimated post-silicon delay value $d_{ij}$ from a path that includes an irregular delay error unique to each of the chips C1 to Cm, in the path set $S'_{ij}$ of the chip Cj. When the second fault flag is "ON", the flag indicates that the corresponding path includes an irregular delay error unique to each of the chips C1 to Cm. The second fault flag is set to "OFF" in the initial state.

Path delay information 1200-1, for example, includes path delay information 1200-1-1 to 1200-1-$n$ concerning paths $P_{11}$ to $P_{n1}$ in the chip C1. In the case of path delay information 1200-1-$i$, a post-silicon delay value "$d_{11}$", an estimated delay value "$d'_1$", a first fault flag "ON" and a second fault flag "OFF" are recorded for a path $P_{11}$. The path delay table 1200 is stored in a storage apparatus, such as the RAM 203, the magnetic disk 205, and the optical disk 207, of a delay fault testing apparatus 1300 depicted in FIG. 13.

Figure 13:
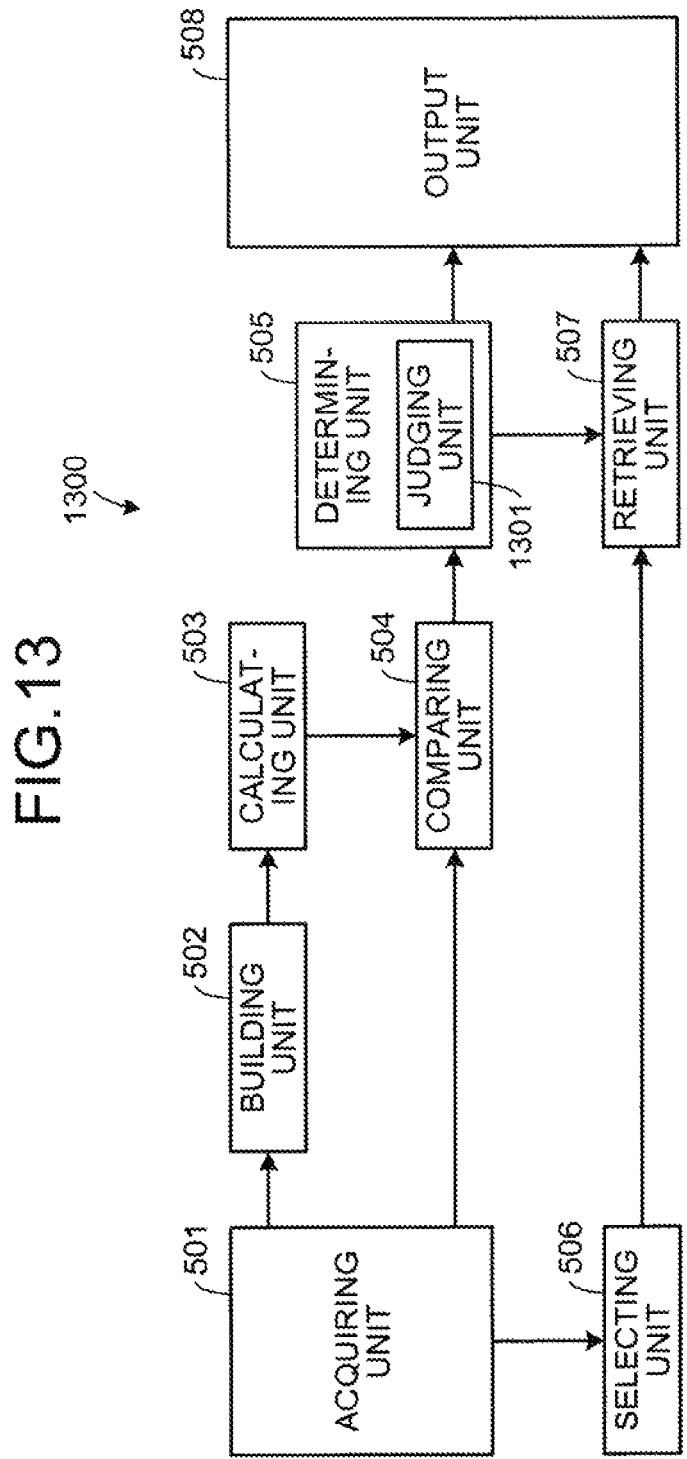
FIG. 13 is a functional diagram of a delay fault testing apparatus according to a second embodiment.

FIG. 13 is a functional diagram of a delay fault testing apparatus according to the second embodiment. As depicted in FIG. 13, the delay fault testing apparatus 1300 includes the acquiring unit 501, the building unit 502, the calculating unit 503, the comparing unit 504, the determining unit 505, the selecting unit 506, the retrieving unit 507, the output unit 508, and a judging unit 1301.

The judging unit 1301 has a function of judging whether a path of the same configuration as the configuration of a fault path candidate $P'_{ij}$ selected from the path set $S'_{ij}$ of the chip Cj is included in a path set $S'_{ik}$ of another chip Ck different from the chip Cj (k≠j, k=1, 2, . . . , m).

It is highly likely that erroneous estimation of the post-silicon delay value $d_{ij}$ occurs in common in all (or 80 to 90% of) chips C1 to Cm. Thus, whether the fault path candidate $P'_{ij}$ is a path with an erroneously estimated post-silicon delay value $d_{ij}$ is judged by judging whether a path of the same configuration as the configuration of the fault path candidate $P'_{ij}$ is included in the path set $S'_{ik}$ of another chip Ck. This means that a path that is a fault path candidate not only in the chip Cj but also in another chip Ck can be judged with high reliability to be a path with an erroneously estimated post-silicon delay value $d_{ij}$.

For example, the judging unit 1301, referring to the path delay table 1200, selects the chip Cj from among the chips C1 to Cm and then, referring to the path delay table 1200, selects the fault path candidate $P'_{ij}$ having the first fault flag set to "ON". Subsequently, the judging unit 1301, referring to the path delay table 1200, retrieves a fault path candidate $P'_{ik}$ having the first fault flag set to "ON".

The determining unit 505 determines the fault path candidate $P'_{ij}$ to be a fault path that includes a delay error irregularly occurring according to chip C1 to Cm, based on a judgment result obtained by the judging unit 1301. For example, if a path of the same configuration as the configuration of the fault path candidate $P'_{ij}$ is not included in the path set $S'_{ik}$ of the chip Ck, the determining unit 505 determines the fault path candidate $P'_{ij}$ to be a fault path.

The determining unit 505 may determine the fault path candidate $P'_{ij}$ to be a fault path if chips Ck that include a path of the same configuration as the configuration of the fault path candidate $P'_{ij}$ account for about 10% of the entire chips. This means an assumption that a path with an erroneously estimated post-silicon delay value $d_{ij}$ is commonly included in chips accounting for 80 to 90% of all chips C1 to Cm.

Figure 14:
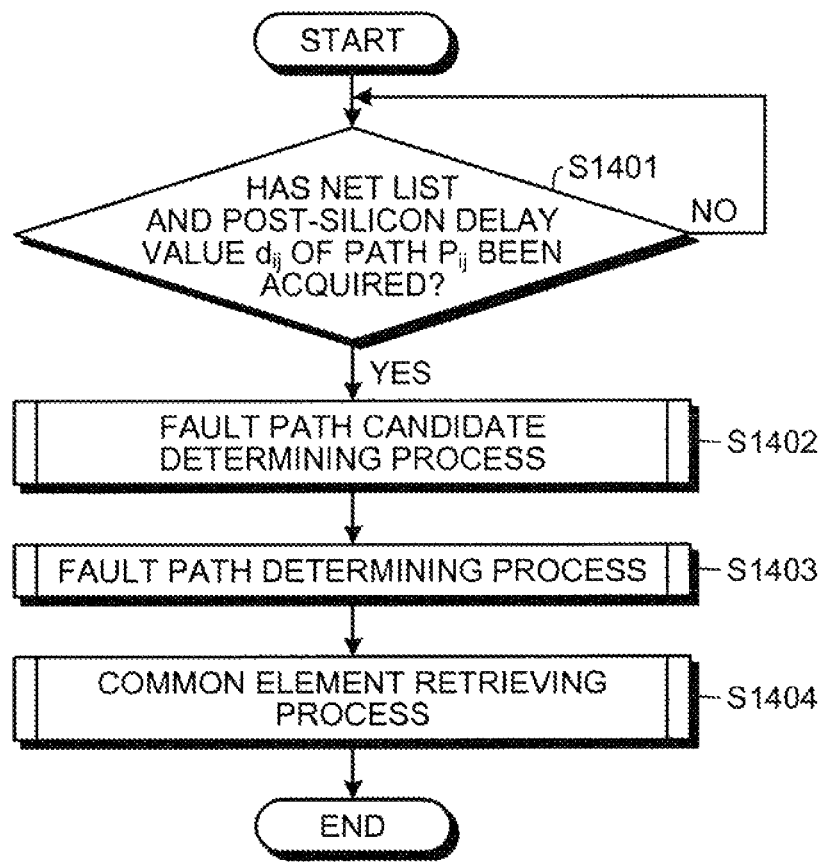
FIG. 14 is a flowchart of an example of a delay fault test procedure according to the second embodiment.

FIG. 14 is a flowchart of an example of a delay fault test procedure according to the second embodiment.

As depicted in the flowchart, the acquiring unit 501 determines whether the net list 300 for a circuit-under-test and the post-silicon delay value $d_{ij}$ of the path $P_{ij}$ have been acquired (step S1401).

Waiting occurs until the net list 300 and the post-silicon delay value $d_{ij}$ are acquired (step S1401: NO). When the net list 300 and the post-silicon delay value $d_{ij}$ have been acquired (step S1401: YES), the determining unit 505 executes a fault path candidate determining process (step S1402).

Subsequently, the determining unit 505 executes a fault path determining process (step S1403). The retrieving unit 507 then executes a common element retrieving process (step S1404), after which a series of processes according to this flowchart is ended.

Figure 15:
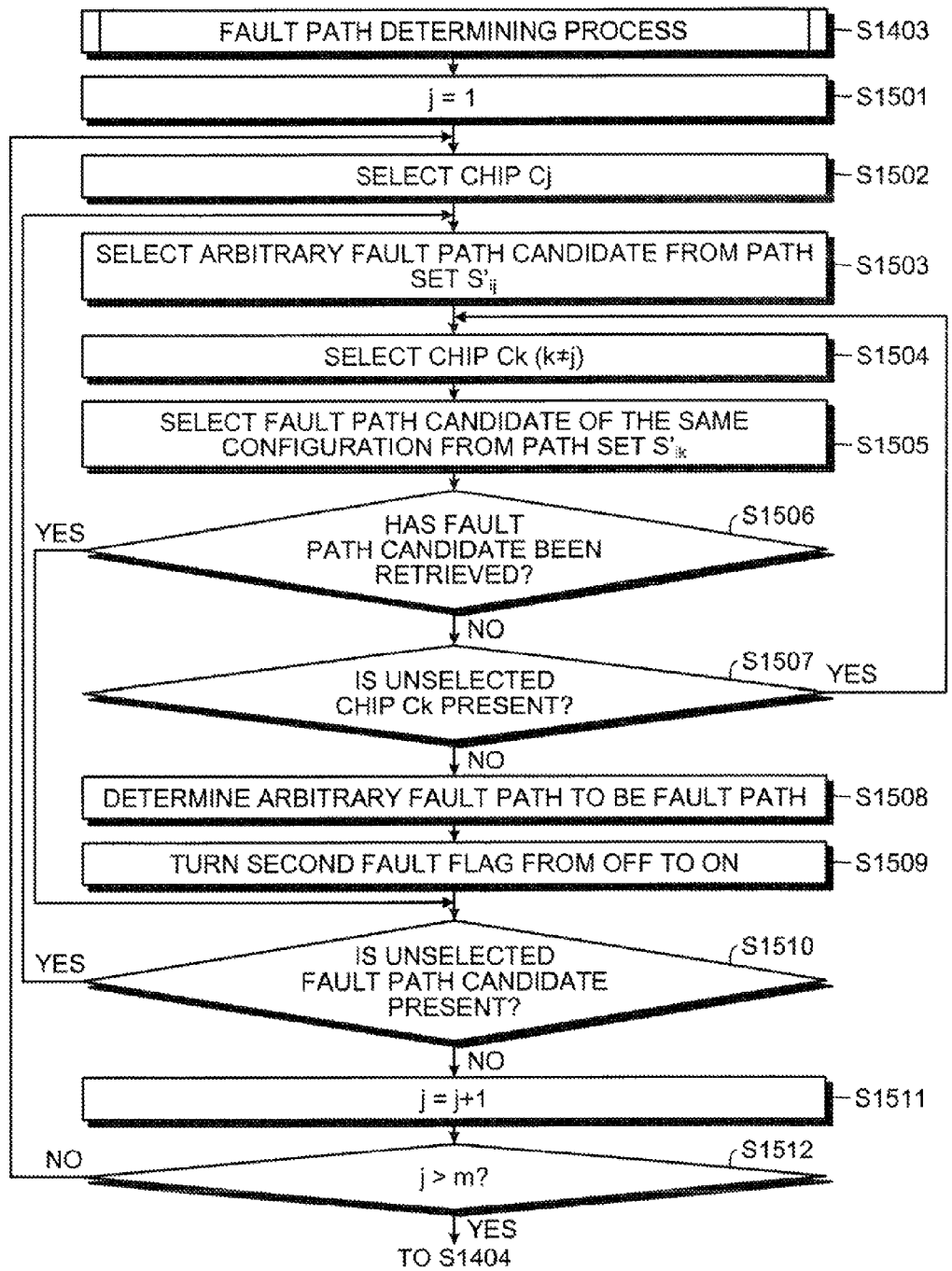
FIG. 15 is a flowchart of an example of a procedure of a fault path determining process.

A procedure of the fault path determining process at step S1403 of FIG. 14 will be described in detail. An example is described where when a path of the same configuration as the configuration of an arbitrary fault path candidate selected from the path set $S'_{ij}$ of the chip Cj is not included in the path set $S'_{ik}$ of the chip Ck and the arbitrary fault path candidate is determined to be a fault path. FIG. 15 is a flowchart of an example of a procedure of the fault path determining process.

As depicted in the flowchart, "j=1" is set (step S1501), and the judging unit 1301 selects the chip Cj from among the chips C1 to Cm (step S1502). Subsequently, the judging unit 1301 selects an arbitrary fault path candidate from the path set $S'_{ij}$ of the chip Cj (step S1503), and then selects the chip Ck (k≠1) from among the chips C1 to Cm (step S1504).

The judging unit 1301 retrieves, from the path set $S'_{ik}$ of the chip Ck, a fault path candidate of the same configuration as the configuration of the arbitrary fault path candidate selected at step S1503 (step S1505). The judging unit 1301 then judges whether a fault path candidate has been retrieved (step S1506).

If a fault path candidate has been retrieved (step S1506: YES), the procedure proceeds to step S1510. If a fault path candidate has not been retrieved (step S1506: NO), the judging unit 1301 judges whether a chip Ck not selected at step S1504 is present (step S1507).

If an unselected chip Ck is present (step S1507: YES), the procedure returns to step S1504. If an unselected chip Ck is not present (step S1507: NO), the determining unit 505 determines the arbitrary fault path candidate to be a fault path (step S1508). The determining unit 505 then turns the second fault flag for the fault path candidate from "OFF" to "ON" in the path delay table 1200 (step S1509).

Subsequently, the judging unit 1301 judges whether a fault path candidate not selected at step S1503 is present (step S1510). If an unselected fault path candidate is present (step S1510: YES), the procedure returns to step S1503.

If an unselected fault path candidate is not present (step S1510: NO), the determining unit 505 increments j by one (step S1511), and determines whether "j>m" is satisfied (step S1512). If "j≦m" is true (step S1512: NO), the procedure returns to step S1502. If "j>m" is true (step S1512: YES), the procedure proceeds to step S1404 of FIG. 14.

In this procedure, a path with an erroneously estimated post-silicon delay value $d_{ij}$ can be excluded from the path set $S'_{ij}$ of the chip Cj.

The procedure of fault path candidate determining process at step S1403 is the same as the procedure of FIG. 9, and is therefore omitted in further description. The procedure of the common element retrieving process at step S1404 is the same as the procedure depicted in FIG. 10, and is therefore omitted in further description. In the procedure of the common element retrieving process at step S1404, the common element to be retrieved is not "fault path candidate" but rather "fault path".

As described above, according to the second embodiment, a path of the same configuration as the configuration of a fault path candidate included in the path set $S'_{ik}$ of another chip Ck is excluded from the path set $S'_{ij}$ of the chip Cj. As a result, a path with an erroneously estimated post-silicon delay value $d_{ij}$ is excluded from the path set $S'_{ij}$ of the chip Cj, enabling a more precise narrowing down of paths that include a delay error irregularly occurring according to chip C1 to Cm.

A delay fault testing method according to a third embodiment will be described. In the third embodiment, a level of similarity between paths included in the path set of the chip Cj is determined, and a path not similar to another fault path candidate is excluded from the path set of the chip Cj, using a level of similarity between paths.

By this method, a path with an erroneously estimated post-silicon delay value $d_{ij}$ is excluded from the path set of the chip Cj. Components identical to those described in the first and the second embodiments will not be depicted nor described further.

Figure 16:
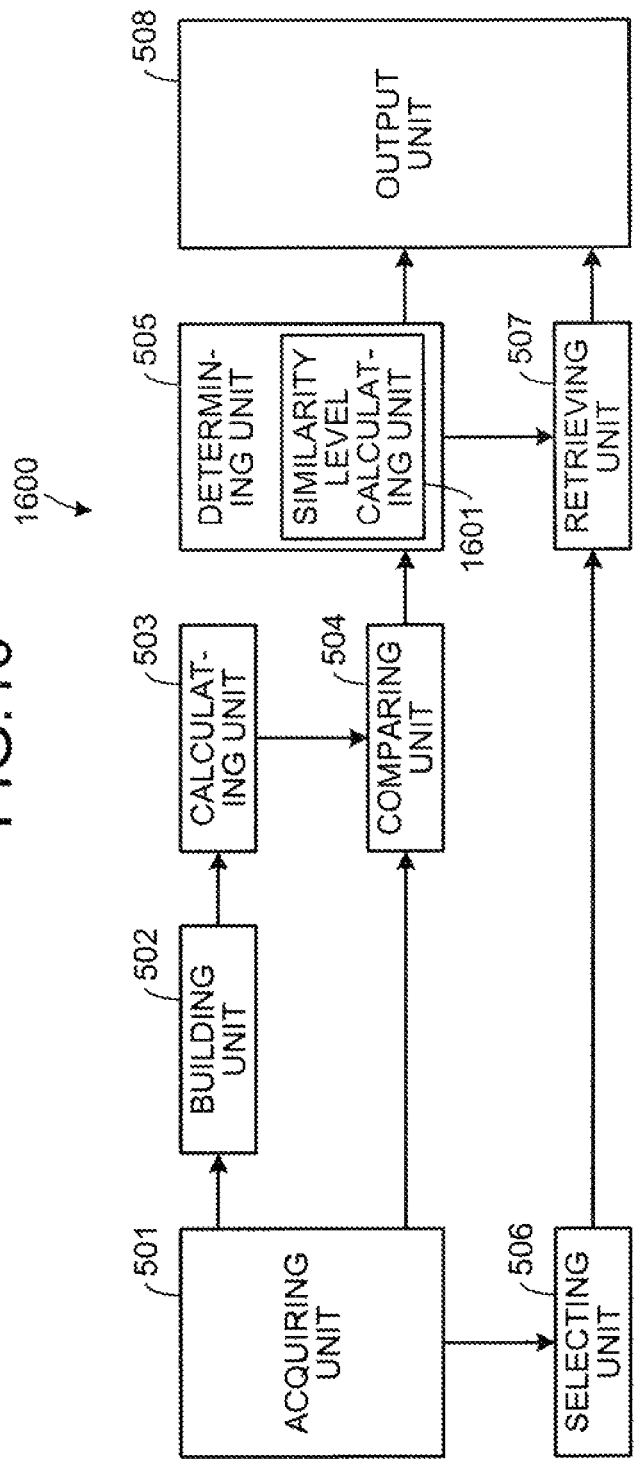
FIG. 16 is a functional diagram of a delay fault testing apparatus according to the third embodiment.

FIG. 16 is a functional diagram of a delay fault testing apparatus according to the third embodiment. In FIG. 16, a delay fault testing apparatus 1600 includes the acquiring unit 501, the building unit 502, the calculating unit 503, the comparing unit 504, the determining unit 505, the selecting unit 506, the retrieving unit 507, the output unit 508, and a similarity level calculating unit 1601.

The similarity level calculating unit 1601 has a function of calculating a level of similarity between the fault path candidate $P'_{ij}$ selected from the path set of the chip Cj and another fault path candidate $P'_{sj}$ different from the fault path candidate $P'_{ij}$ (s≠I, s=1, 2, ..., t≦n).

For example, the similarity level calculating unit 1601 builds a function model for calculating a level of similarity between paths, using one-class SVR. The fault path candidates P'$_{ij}$ and P'$_{sj}$ are expressed as vectors by equations (2) and (3).

In equations (2) and (3), $g_i1$ to $g_ip$ and $g_s1$ to $g_sp$ are variables that take a value of "1" when the fault path candidates P'$_{ij}$ and P'$_{sj}$ include the gates g1 to gp and that take a value of "0" when the fault path candidates P'$_{ij}$ and P'$_{sj}$ do not include the gates g1 to gp, and $s_i1$ to $s_iq$ and $s_s1$ to $s_sq$ are variables that take a value of "1" when the fault path candidates P'$_{ij}$ and P'$_{sj}$ include the signal lines s1 to sq and that take a value of "0" when the fault path candidates P'$_{ij}$ and P'$_{sj}$ do not include the signal lines s1 to sq.

$$P'_{ij}=(g_i1, g_i2, \ldots, g_ip, s_i1, s_i2, \ldots, s_iq) \quad (2)$$

$$P'_{sj}=(g_s1, g_s2, \ldots, g_sp, s_s1, s_s2, \ldots, s_sq) \quad (3)$$

In this case, a level of similarity between the fault path candidate P'$_{ij}$ and the fault path candidate P'$_{sj}$ can be expressed by equation (4), where P'$_{ij}$·P'$_{sj}$ represents the level of similarity between the fault path candidate P'$_{ij}$ and the fault path candidate P'$_{sj}$.

$$P'_{ij} \cdot P'_{sj} = g_i1 \times g_s1 + g_i2 \times g_s2 + \ldots + g_ip \times g_sp + s_i1 \times s_s1 + s_i2 \times s_s2 + \ldots + s_iq \times s_sq \quad (4)$$

For example, the similarity level calculating unit 1601 substitutes connection information of the fault path candidate P'$_{ij}$ and the fault path candidate P'$_{sj}$ to the above equation (4), based on the net list 300 and calculates the level of similarity.

The determining unit 505 determines the fault path candidates P'$_{ij}$ to be a fault path including a delay error occurring irregularly in each of the chips C1 to Cj, based on the calculated level of similarity. For example, the determining unit 505 may determine a fault path candidate P'$_{ij}$ having a level of similarity of "1" or more with respect to a fault path candidate P'$_{sj}$, to be a fault path. In other words, when a level of similarity between fault path candidates is "1" or more, it is determined that the fault path candidates are highly likely to include an element causing a delay fault.

Although both gates and signal lines are considered in the equation (4), configuration is not limited hereto. For example, when a gate delay fault is assumed as a delay fault, gates alone may be considered, or when a transition delay fault is assumed as a delay fault, signal lines alone may be considered.

Figure 17:
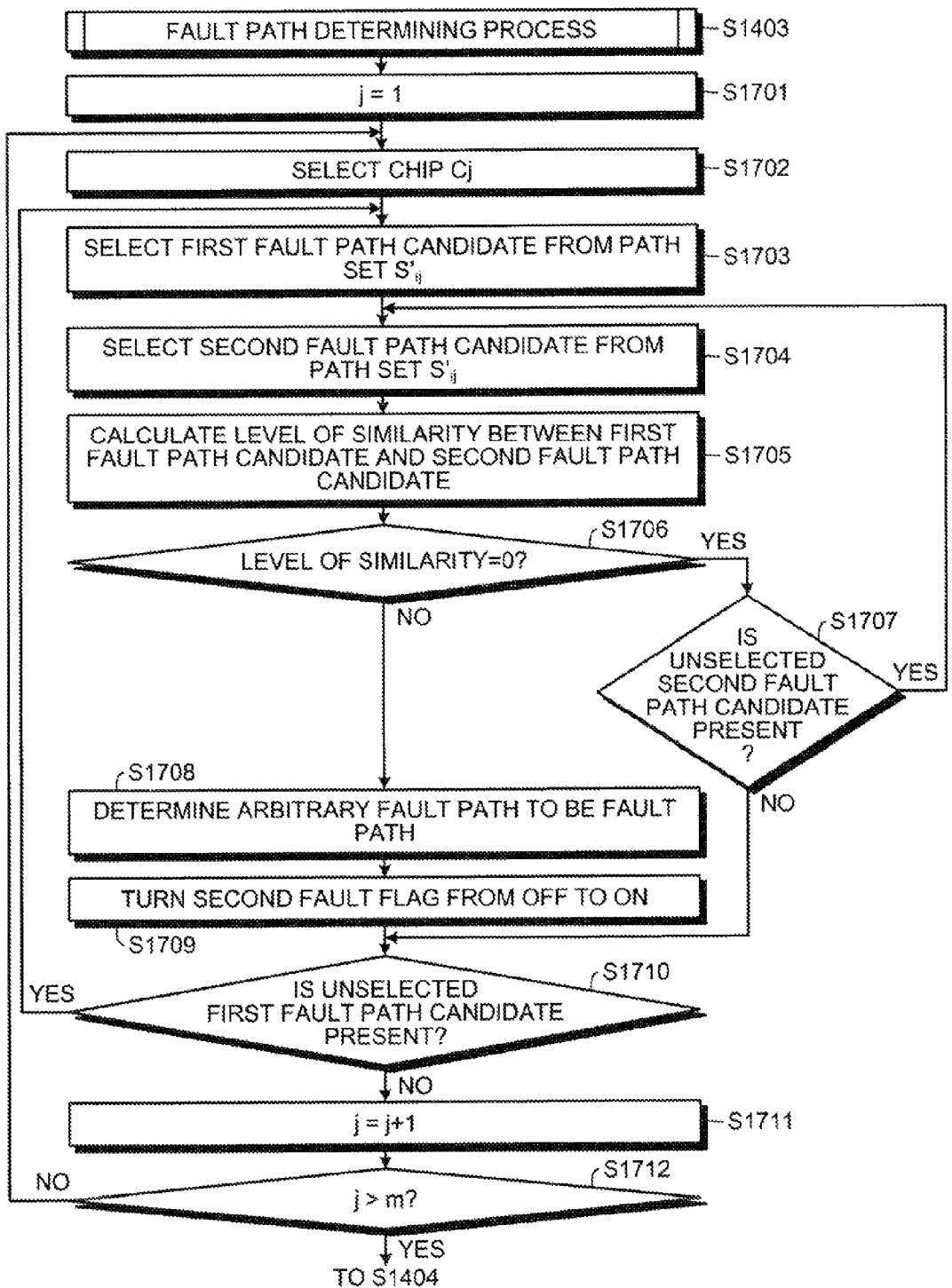
FIG. 17 is a flowchart of another example of a procedure of the fault path determining process.

A fault path determining procedure by the delay fault testing apparatus 1600 of the third embodiment will be described. This fault path determining procedure is equivalent to the fault path determining process at step S1403 of FIG. 14. FIG. 17 is a flowchart of another example of a procedure of the fault path determining process.

As depicted in the flowchart, "j=1" is set (step S1701), and the similarity level calculating unit 1601 selects the chip Cj from among the chips C1 to Cm (step S1702). Subsequently, the similarity level calculating unit 1601 selects a first fault path candidate from the path set S'$_{ij}$ of the chip Cj (step S1703).

The similarity level calculating unit 1601 then selects a second fault path candidate from the path set S'$_{ij}$ of the chip Cj (step S1704). The first and the second fault path candidates are different from each other. The similarity level calculating unit 1601 calculates a level of similarity between the first fault path candidate and the second fault path candidate, using the net list 300 and equation (4) (step S1705).

Subsequently, the determining unit 505 determines whether the calculated level of similarity is "0" (step S1706). If the level of similarity is "0", the determining unit 505 determines whether a second fault path candidate not selected at step S1704 is present (step S1707).

If an unselected second fault path candidate is present (step S1707: YES), the procedure returns to step S1704. If an unselected second fault path candidate is not present (step S1707: NO), the procedure proceeds to step S1710.

If the level of similarity is not "0" at step S1706 (step S1706: NO), the determining unit 505 determines the first fault path candidate to be a fault path (step S1708). The determining unit 505 then turns the second fault flag for the first fault path candidate, from "OFF" to "ON" in the path delay table 1200 (step S1709).

Subsequently, the determining unit 505 determines whether a first fault path candidate not selected at step S1703 is present (step S1710). If an unselected first fault path candidate is present (step S1710: YES), the procedure returns to step S1703.

If an unselected first fault path candidate is not present (step S1710: NO), the determining unit 505 increments j by one (step S1711), and determines whether "j>m" is satisfied (step S1712). If "j≦m" is true (step S1712: NO), the procedure returns to step S1702. If "j>m" is true (step S1712: YES), the procedure proceeds to step S1404 in FIG. 14.

As described above, according to the third embodiment, a level of similarity between paths included in the path set S'$_{ij}$ of the chip Cj is determined, thereby enabling a path that is not similar to another fault path candidate to be excluded from the path set S'$_{ij}$. As a result, a path with an erroneously estimated post-silicon delay value d$_{ij}$ is excluded from the path set S'$_{ij}$ of the chip Cj, enabling a more precise narrowing down of paths that include a delay error irregularly occurring according to chip C1 to Cm.

A delay fault testing method according to a fourth embodiment will be described. In the fourth embodiment, a function model representing a delay value of the path P$_i$ is built with attention paid only to the chip Cj. The chip Cj is a chip where the percentage of fault path candidates to a set of paths included in the chip is equal to or more than a preset given value.

In the fourth embodiment, the post-silicon delay value d$_{ij}$ of the path P$_{ij}$ included in the chip Cj is substituted into the function model to determine the estimated delay value d'$_i$ of the path P$_i$. Subsequently, in the fourth embodiment, a difference between a post-silicon delay value of the fault path candidate P'$_{ij}$ and the estimated delay value d'$_i$ of the path Pi is determined.

In the fourth embodiment, a fault path candidate having a difference beyond a tolerable range is determined to be a path with an erroneously estimated post-silicon delay value d$_{ij}$. As described above, the chip Cj is a chip where the percentage of fault path candidates to a set of paths is equal to or more than the given value. Consequently, when the function model is built with attention paid to the chip Cj alone, the estimated delay value d'$_i$ of the path P$_i$ includes not only a systematic delay error but also an irregular delay error in the function model.

As a result, a path having a difference beyond the tolerable range can be determined to be a path with the erroneously estimated post-silicon delay value d$_{ij}$. Hence a path with an erroneously estimated post-silicon delay value d$_{ij}$ can be excluded from the path set of the chip Cj. Components identical to those described in the first to the third embodiments will not be depicted nor described further.

Figure 18:
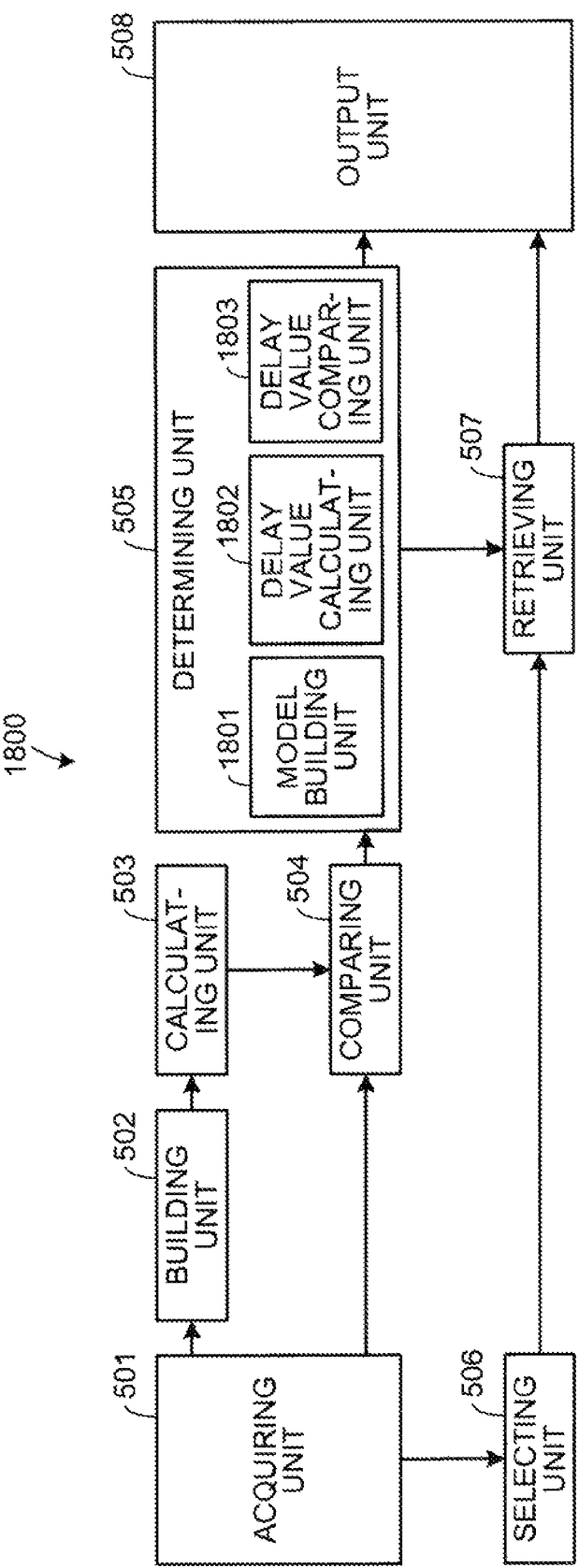
FIG. 18 is a block diagram of a functional configuration of a delay fault testing apparatus according to the fourth embodiment.

FIG. 18 is a block diagram of a functional configuration of a delay fault testing apparatus according to the fourth embodiment. As depicted in FIG. 18, a delay fault testing apparatus 1800 includes the acquiring unit 501, the building unit 502, the calculating unit 503, the comparing unit 504, the determining unit 505, the selecting unit 506, the retrieving unit 507, the output unit 508, a model building unit 1801, a delay value calculating unit 1802, and a delay value comparing unit 1803.

The model building unit 1801 builds a function model representing a delay value of the path $P_i$, based on the post-silicon delay value $d_{ij}$ of the path $P_{ij}$ and on the net list 300. For example, the model building unit 1801 determines the factors $X_1$ to $X_p$ and $Y_1$ to $Y_q$ included in equation (1), using ϵ-SVR.

For example, the model building unit 1801 substitutes the post-silicon delay values $d_{ij}$ of paths $P_{ij}$ included in the chip Cj to the left side of equation (1) while giving connection information 300-$i$ of paths $P_i$ to the right side of equation (1), thereby generating n equations having the factors $X_1$ to $X_p$ and $Y_1$ to $Y_q$ as unknown values. Subsequently, the building unit 502 determines the factors $X_1$ to $X_p$ and $Y_1$ to $Y_q$ that minimize error between the left side and the right side of each equation, using ϵ-SVR (or least squares).

The delay value calculating unit 1802 calculates the estimated delay value $d'_i$ of the path $P_i$, using the built function model and the net list 300. For example, the delay value calculating unit 1802 substitutes connection information 300-$i$ of the path $P_i$ to the right side of equation (1) and determines the estimated delay value $d'_i$ of the path $P_i$, provided that the factors $X_1$ to $X_p$ and $Y_1$ to $Y_q$ are known. The estimated delay value $d'_i$ of the path $P_i$ includes a systematic error and an irregular delay error.

The delay value comparing unit 1803 compares a post-silicon delay value of the fault path candidate $P'_{ij}$ and the calculated estimated delay value $d'_i$ of the path $P_i$, where the fault path candidate $P'_{ij}$ and the path $P_i$ are the paths having the same configuration. For example, the delay value comparing unit 1803 subtracts the post-silicon delay value of the fault path candidate $P'_{ij}$ from the estimated delay value $d'_i$ of the path $P_i$ to calculate a difference between both values.

The determining unit 505 determines a path that includes a delay error irregularly occurring according to chip C1 to Cm, from among a path set consisting of paths $P_i$ included in the chip Cj, based on the difference obtained by the delay value comparing unit 1803. For example, the determining unit 505 determines a fault path candidate $P'_{ij}$ for which the calculated difference equal to or less than a threshold to be a fault path. The threshold may be set arbitrarily. For example, the determining unit 505 determines the threshold to be 10 to 20% of the estimated delay value $d'_i$ of the path $P_i$.

A fault path determining procedure by the delay fault testing apparatus 1800 according to the fourth embodiment will be described. This fault path determining procedure is equivalent to the fault path determining process at step S1403 of FIG. 14.

Figure 19:
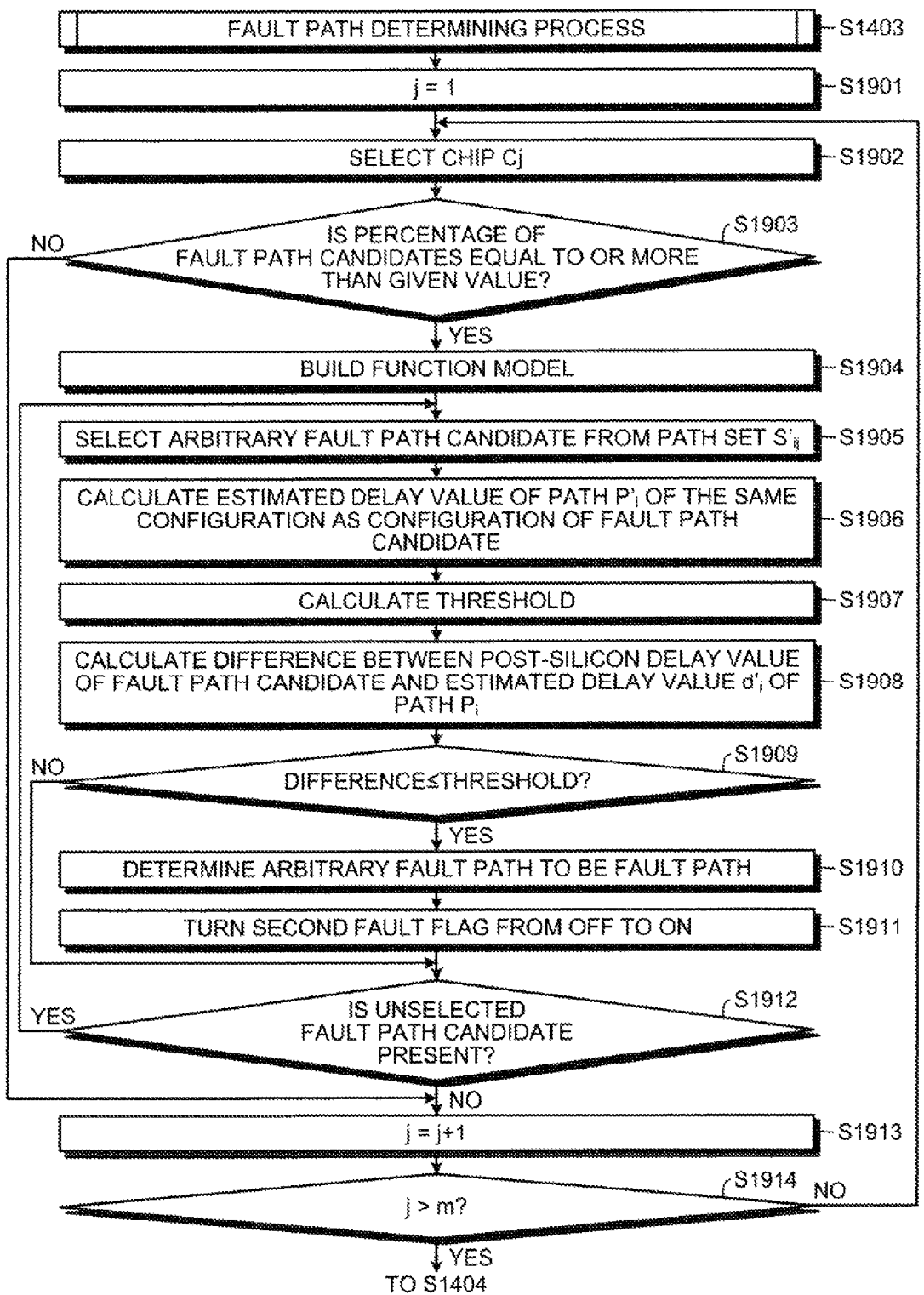
FIG. 19 is a flowchart of another example of a procedure of the fault path determining process.

FIG. 19 is a flowchart of another example of a procedure of the fault path determining process. As depicted in the flowchart, "j=1" is set (step S1901), and the determining unit 505 selects the chip Cj from among the chips C1 to Cm (step S1902).

The determining unit 505 determines whether the percentage of fault path candidates to a set of paths included in the chip Cj is at least equal to a preset given value (step S1903). The given value is stored in a storage apparatus, such as the ROM 202, RAM 203, the magnetic disk 205, and the optical disk 207.

If the percentage is less than the given value (step S1903: NO), the procedure proceeds to step S1913. If the percentage is equal to or more than the given value (step S1903: YES), the model building unit 1801 builds a function model representing a delay value of the path $P_i$ (step S1904).

The delay value calculating unit 1802 selects an arbitrary fault path candidate from the path set $S'_{ij}$ of the chip Cj (step S1905). The delay value calculating unit 1802 then calculates the estimated delay value $d'_i$ of the path $P_i$ having the same configuration as the configuration of the selected fault path candidate, using the built function model and the net list 300 (step S1906). The determining unit 505 calculates a threshold using the estimated delay value $d'_i$ of the path $P_i$ (step S1907).

Subsequently, the delay value comparing unit 1803 calculates a difference between a post-silicon delay value of the fault path candidate and the estimated delay value $d'_i$ of the path $P_i$ (step S1908). The determining unit 505 then determines whether the calculated difference is at most the threshold calculated at step S1907 (step S1909).

If the difference is greater than the threshold (step S1909: NO), the procedure proceeds to step S1912. If the difference is equal to or less than the threshold (step S1909: YES), the determining unit 505 determines the fault path candidate selected at step S1905 to be a fault path candidate (step S1910), and turns the second fault flag for the fault path candidate from "OFF" to "ON" in the path delay table 1200 (step S1911).

Subsequently, the model building unit 1801 determines whether a fault path candidate not selected at step S1905 is present (step S1912). If an unselected fault path candidate is present (step S1912: YES), the procedure returns to step S1905.

If an unselected fault path candidate is not present (step S1912: NO), the determining unit 505 increments j by one (step S1913), and determines whether "j>m" is satisfied (step S1914). If "j≦m" is true (step S1914: NO), the procedure returns to step S1902. If "j>m" is true (step S1914: YES), the procedure proceeds to step S1404 in FIG. 14.

As described above, according to the fourth embodiment, when a difference between a post-silicon delay value of a fault path candidate and the estimated delay value $d'_i$ of the path $P_i$ is within a tolerable range, a path defined as the fault path candidate is determined to be a fault path. As a result, a path with an erroneously estimated post-silicon delay value $d_{ij}$ is excluded from the path set $S'_{ij}$ of the chip Cj, enabling a more precise narrowing down of paths that include a delay error irregularly occurring according to chip C1 to Cm.

The delay fault testing method described in the present embodiment may be implemented by executing a prepared program on a computer such as a personal computer and a workstation. The program is stored on a computer-readable recording medium such as a hard disk, a flexible disk, a CD-ROM, an MO, and a DVD, read out from the recording medium, and executed by the computer. The program may be a transmission medium that can be distributed through a network such as the Internet.

The embodiments herein offer an effect of reducing the trouble and time consumed to identify a delay fault occurring irregularly according to chip.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A tangible computer-readable recording medium storing therein a delay fault testing program causing a computer to execute:
   acquiring for each chip, first delay values of paths included in a plurality of chips manufactured using circuit information concerning a circuit-under-test;
   building a function model representing a delay value of a path, based on the acquired first delay values for the paths and on the circuit information;
   calculating a second delay value of a path included in and having the same configuration in each of the chips, using the function model built at the building and the circuit information;
   comparing for each of the chips, the second delay value and the first delay value of a path having a configuration identical to that of the path for which the second delay value has been calculated;
   determining based on a comparison result obtained at the comparing, the path having a configuration identical to that of the path for which the second delay value has been calculated, to be a path that includes a delay error occurring irregularly according to chip; and
   outputting a determination result obtained at the determining.

2. The computer-readable recording medium according to claim 1 and storing therein the delay fault testing program further causing the computer to execute:
   searching paths determined at the determining as fault path candidates, for an element included in common in a first fault path candidate and a second fault path candidate that are included in a chip selected from among the chips,
   wherein the outputting includes outputting the element retrieved at the searching.

3. The computer-readable recording medium according to claim 1 and storing therein the delay fault testing program further causing the computer to execute:
   judging whether the path determined at the determining as a fault path candidate and having a configuration identical to that of an arbitrary fault path candidate determined at the determining and included in a first chip selected from among the chips, is included in a second chip that is different from the first chip,
   wherein the determining includes determining the arbitrary fault path candidate to be a path that includes the delay error occurring irregularly according to chip, based on a judgment result obtained at the judging.

4. The computer-readable recording medium according to claim 1 and storing therein the delay fault testing program further causing the computer to execute:
   calculating, based on the circuit information and a function model representing a level of path similarity, the level of path similarity between paths respectively determined at the determining as a first fault path candidate and a second fault path candidate and respectively included in an arbitrary chip selected from among the chips,
   wherein the determining includes determining the first fault path candidate to be a path that includes the delay error occurring irregularly according to chip, based on the calculated level of similarity.

5. The computer-readable recording medium according to claim 1, wherein
   the building includes building, based on the circuit information and the first delay value of a path included in an arbitrary chip selected from among the chips, a function model representing a delay value of the path,
   the calculating includes, using the built function model and the circuit information to calculate a second delay value of a first fault path candidate determined at the determining and included in the arbitrary chip,
   the comparing includes comparing the second delay value of the first fault path candidate and the first delay value of a second fault path candidate having a configuration identical to that of the first fault path candidate, and
   the determining includes determining the second fault path candidate to be a path that includes a delay error occurring irregularly according to chip, based on the comparison result obtained at the comparing.

6. A delay fault testing apparatus comprising:
   an acquiring unit that acquires for each chip, first delay values of paths included in a plurality of chips manufactured using circuit information concerning a circuit-under-test;
   a building unit that builds a function model representing a delay value of a path, based on the acquired first delay values for the paths and on the circuit information;
   a calculating unit that calculates a second delay value of a path included in and having the same configuration in each of the chips, using the function model built by the building unit and the circuit information;
   a comparing unit that for each of the chips, compares the second delay value and the first delay value of a path having a configuration identical to that of the path for which the second delay value has been calculated;
   a determining unit that determines based on a comparison result obtained by the comparing unit, the path having a configuration identical to that of the path for which the second delay value has been calculated, to be a path that includes a delay error occurring irregularly according to chip; and
   an output unit that outputs a determination result obtained by the determining unit.

7. A delay fault testing method executed by a computer comprising a control unit and a storage unit, comprising:
   acquiring for each chip, first delay values of paths included in a plurality of chips manufactured using circuit information concerning a circuit-under-test and storing the acquired first delay values in the storage unit via the control unit;
   building a function model representing a delay value of a path, based on the acquired first delay values for the paths and on the circuit information, and storing the built function in the storage unit via the control unit;
   calculating a second delay value of a path included in and having the same configuration in each of the chips, using the circuit information and the function model built at the building, and storing the second delay value in the storage unit via the control unit;
   comparing for each of the chips, the second delay value and the first delay value of a path having a configuration identical to that of the path for which the second delay value has been calculated;
   determining based on a comparison result obtained at the comparing, the path having a configuration identical to that of the path for which the second delay value has been calculated, to be a path that includes a delay error occurring irregularly according to chip and storing a determination result in the storage apparatus via the control unit; and
   outputting via the control unit, a determination result obtained at the determining.

* * * * *